(12) United States Patent
Huang

(10) Patent No.: US 11,552,081 B2
(45) Date of Patent: Jan. 10, 2023

(54) METHOD FOR FABRICATING A SEMICONDUCTOR DEVICE AND THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/334,397

(22) Filed: May 28, 2021

(65) Prior Publication Data

US 2021/0288052 A1 Sep. 16, 2021

Related U.S. Application Data

(62) Division of application No. 16/591,865, filed on Oct. 3, 2019, now Pat. No. 11,088,141.

(51) Int. Cl.
*H01L 27/108* (2006.01)
*H01L 29/49* (2006.01)
(Continued)

(52) U.S. Cl.
CPC .... *H01L 27/10814* (2013.01); *H01L 23/3171* (2013.01); *H01L 24/03* (2013.01);
(Continued)

(58) Field of Classification Search
CPC .......... H01L 27/10814; H01L 23/3171; H01L 24/03; H01L 24/05; H01L 27/1085; H01L 28/60; H01L 29/49
(Continued)

(56) References Cited

U.S. PATENT DOCUMENTS

| | | | |
|---|---|---|---|
| 2008/0258262 A1* | 10/2008 | Nagai | H01L 27/11509 257/535 |
| 2009/0008793 A1 | 1/2009 | Saigoh et al. | |
| 2019/0006300 A1 | 1/2019 | Moriyama et al. | |

FOREIGN PATENT DOCUMENTS

| | | |
|---|---|---|
| TW | 200631096 A | 9/2006 |
| TW | 201730986 A | 9/2017 |

(Continued)

OTHER PUBLICATIONS

Office Action dated Sep. 7, 2020 related to Taiwanese Application No. 109119357.

*Primary Examiner* — Thinh T Nguyen
(74) *Attorney, Agent, or Firm* — Muncy, Geissler, Olds & Lowe, P.C.

(57) ABSTRACT

The present application discloses a method for fabricating a semiconductor device with a pad structure. The method includes providing a substrate, forming a capacitor structure above the substrate, forming a plurality of passivation layers above the capacitor structure, forming a pad opening in the plurality of passivation layers, performing a passivation process comprising soaking the pad opening in a precursor, and forming a pad structure in the pad opening. The precursor is dimethylaminotrimethylsilane or tetramethylsilane. Forming the pad structure in the pad opening comprises forming a pad bottom conductive layer comprising nickel in the pad opening and forming a pad top conductive layer on the pad bottom conductive layer. The pad top conductive layer comprises palladium, cobalt, or a combination thereof.

5 Claims, 39 Drawing Sheets

(51) Int. Cl.
*H01L 23/31* (2006.01)
*H01L 23/00* (2006.01)
*H01L 49/02* (2006.01)

(52) U.S. Cl.
CPC .......... *H01L 24/05* (2013.01); *H01L 27/1085* (2013.01); *H01L 28/60* (2013.01); *H01L 29/49* (2013.01); *H01L 2224/05073* (2013.01); *H01L 2224/05155* (2013.01); *H01L 2224/05573* (2013.01); *H01L 2224/05657* (2013.01); *H01L 2224/05664* (2013.01)

(58) Field of Classification Search
USPC .......................... 257/288, 296; 438/197, 238
See application file for complete search history.

(56) References Cited

FOREIGN PATENT DOCUMENTS

| | | |
|---|---|---|
| TW | 201832332 A | 9/2018 |
| TW | 201921623 A | 6/2019 |

\* cited by examiner

METHOD FOR FABRICATING A SEMICONDUCTOR DEVICE AND THE SAME

CROSS-REFERENCE TO RELATED APPLICATION

This application is a divisional application of U.S. Non-Provisional application Ser. No. 16/591,865 filed Oct. 3, 2019, which is incorporated herein by reference in its entirety.

TECHNICAL FIELD

The present disclosure relates to a method for fabricating a semiconductor device, and more particularly, to a method for fabricating a semiconductor device with a pad structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the demand for increasing computing ability. However, a variety of issues arise during the scaling-down process, and challenges remain in achieving improved quality, yield, performance and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a capacitor structure positioned above the substrate, a plurality of passivation layers positioned above the capacitor structure, and a pad structure positioned in the plurality of passivation layers. The pad structure comprises a pad bottom conductive layer comprising nickel and a pad top conductive layer positioned on the pad bottom conductive layer. The pad top conductive layer comprises palladium, cobalt, or a combination thereof.

In some embodiments, the plurality of passivation layers comprise a first passivation layer positioned above the capacitor structure, a second passivation layer positioned on the first passivation layer, and a third passivation layer positioned on the second passivation layer, wherein the pad bottom conductive layer is positioned in the first passivation layer and electrically coupled to the capacitor structure.

In some embodiments, the semiconductor device further comprises a fourth passivation layer positioned on the third passivation layer, and a bonding opening positioned in the fourth passivation layer, wherein the fourth passivation layer comprise polyimide and a top surface of the pad top conductive layer is exposed through the bonding opening.

In some embodiments, a width of the bonding opening is less than a width of the pad top conductive layer.

In some embodiments, the semiconductor device further comprises spacers attached to two sides of the pad structure.

In some embodiments, the semiconductor device further comprises a plurality of bit lines positioned between the substrate and the capacitor structure and extending along a first direction, wherein the plurality of bit lines are formed as wavy lines.

In some embodiments, the semiconductor device further comprises an isolation layer positioned in the substrate, wherein the isolation layer defines a plurality of active regions extending along a second direction, wherein the second direction is diagonal with respect to the first direction.

In some embodiments, the semiconductor device further comprises a plurality of word lines positioned in the substrate and extending along a third direction, wherein the third direction is diagonal with respect to the first direction and perpendicular to the second direction.

In some embodiments, the capacitor structure comprises a plurality of capacitor bottom electrodes inwardly positioned above the substrate, a capacitor insulating layer positioned over the plurality of capacitor bottom electrodes, and a capacitor top electrode positioned over the capacitor insulating layer.

In some embodiments, the semiconductor device further comprises a plurality of supporting structures positioned partially attached to outer surfaces of the plurality of capacitor bottom electrodes, wherein some of the plurality of supporting structures extend along the first direction and are separated from each other, and others of the plurality of supporting structures extend along the third direction and are separated from each other.

Another aspect of the present disclosure provides a semiconductor device including a substrate, a gate structure positioned above the substrate, a plurality of passivation layers positioned above the gate structure, and a pad structure positioned in the plurality of passivation layers. The pad structure comprises a pad bottom conductive layer comprising nickel and a pad top conductive layer positioned on the pad bottom conductive layer. The pad top conductive layer comprises palladium, cobalt, or a combination thereof.

In some embodiments, the plurality of passivation layers comprise a first passivation layer positioned above the gate structure, a second passivation layer positioned on the first passivation layer, and a third passivation layer positioned on the second passivation layer, wherein the pad bottom conductive layer is positioned in the first passivation layer and electrically coupled to the gate structure.

In some embodiments, the gate structure comprises a gate bottom layer positioned on the substrate, a gate middle layer positioned on the gate bottom layer, and a gate top layer positioned on the gate middle layer.

In some embodiments, the semiconductor device further comprises a fourth passivation layer positioned on the third passivation layer, and a bonding opening positioned in the fourth passivation layer, wherein the fourth passivation layer comprises polyimide and a top surface of the pad top conductive layer is exposed through the bonding opening.

In some embodiments, a width of the bonding opening is less than a width of the pad top conductive layer.

Another aspect of the present disclosure provides a method for fabricating a semiconductor device including providing a substrate, forming a capacitor structure above the substrate, forming a plurality of passivation layers above the capacitor structure, forming a pad opening in the plurality of passivation layers, performing a passivation process comprising soaking the pad opening in a precursor, and forming a pad structure in the pad opening. The precursor is dimethylaminotrimethylsilane or tetramethylsilane. Forming the pad structure in the pad opening comprises forming a pad bottom conductive layer comprising nickel in the pad opening and forming a pad top conductive layer on the pad bottom conductive layer. The pad top conductive layer comprises palladium, cobalt, or a combination thereof.

In some embodiments, the method for fabricating the semiconductor device further comprises: performing a cleaning process, wherein the cleaning process comprises applying a remote plasma to the pad opening.

In some embodiments, forming the plurality of passivation layers above the capacitor structure comprises: forming a first passivation layer above the capacitor structure; forming a second passivation layer on the first passivation layer; and forming a third passivation layer on the second passivation layer.

In some embodiments, the method for fabricating the semiconductor device further comprises: forming a fourth passivation layer comprising polyimide on the third passivation layer; and forming a bonding opening in the fourth passivation layer and exposing a portion of a top surface of the pad top conductive layer.

In some embodiments, a process temperature of the passivation process is between about 200° C. and about 400° C.

Due to the design of the semiconductor device of the present disclosure, the performance and reliability of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
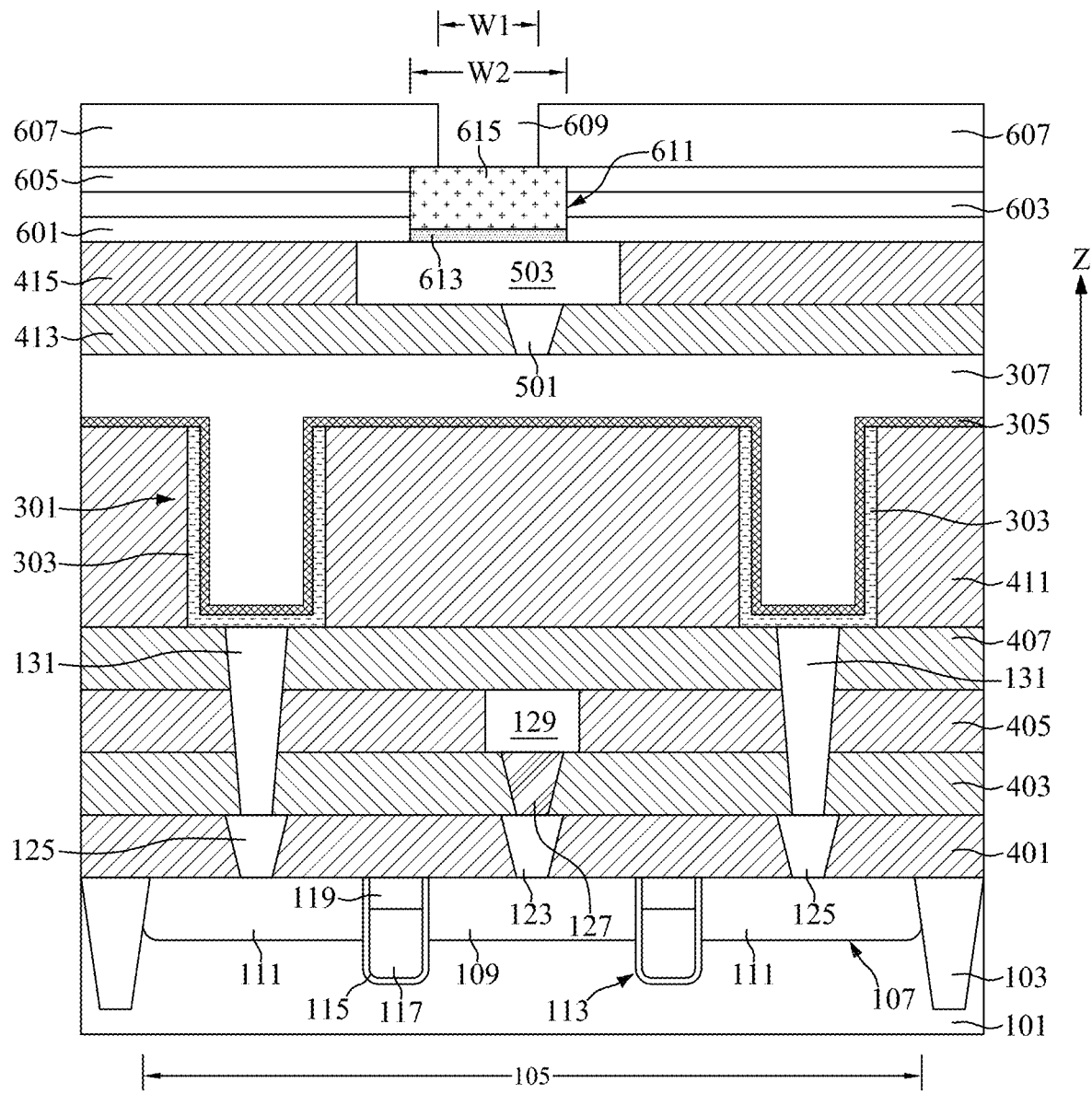
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
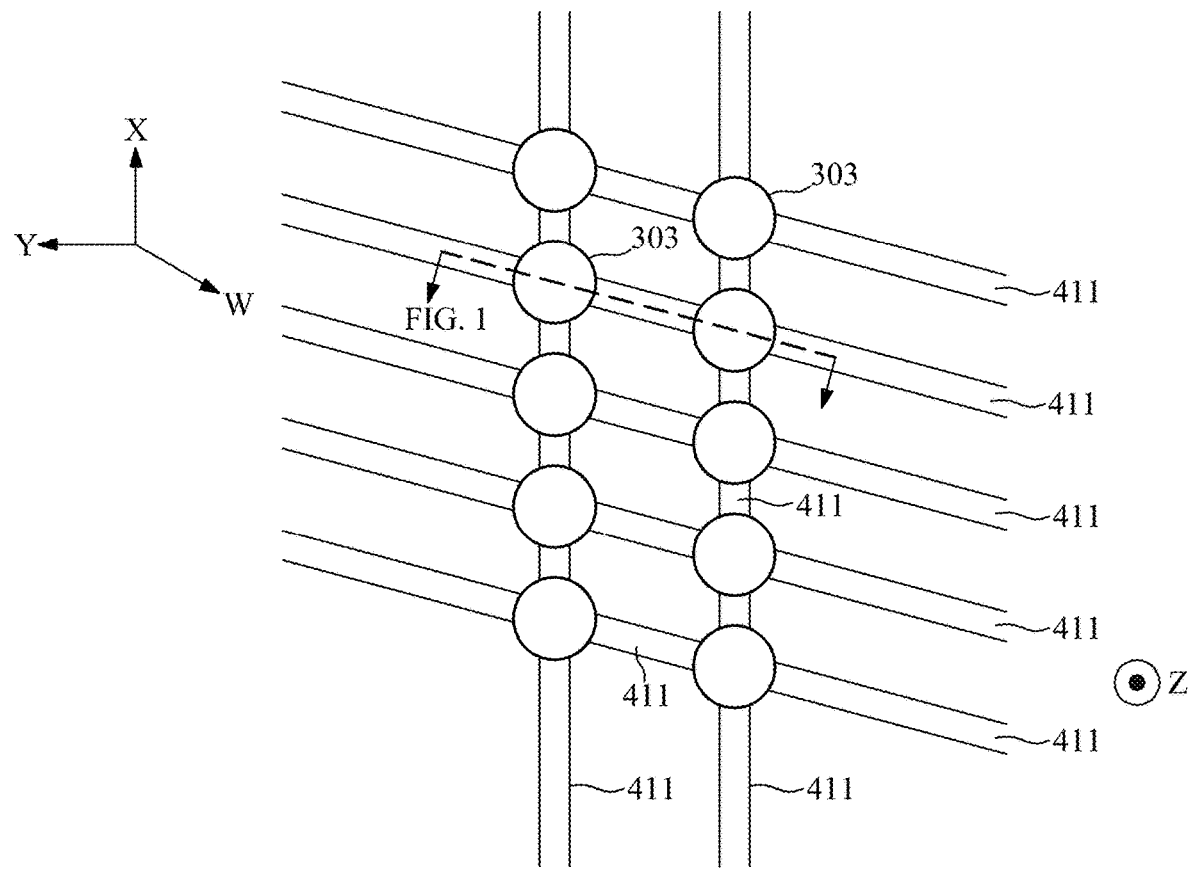
FIG. 2 illustrates, in a schematic top-view diagram, the semiconductor device in accordance with FIG. 1.

FIG. 1 illustrates, in a schematic cross-sectional view diagram, a semiconductor device in accordance with one embodiment of the present disclosure. FIG. 2 illustrates, in a schematic top-view diagram, the semiconductor device in accordance with FIG. 1. Some elements of the semiconductor device of the present disclosure are not shown in FIG. 1 for clarity.

With reference to FIGS. 1 and 2, in the embodiment depicted, the semiconductor device may include a substrate 101, an isolation layer 103, a plurality of first doped regions 109, a plurality of second doped regions 111, a plurality of word lines 113, a plurality of contacts, a plurality of bit line contacts 127, a plurality of bit lines 129, a plurality of plugs 131, a capacitor structure 301, a plurality of insulating films, a plurality of conductive elements, a plurality of passivation layers, a bonding opening 609, and a pad structure 611.

With reference to FIGS. 1 and 2, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIGS. 1 and 2, in the embodiment depicted, the isolation layer 103 may be disposed in an upper portion of the substrate 101. The isolation layer 103 may be formed of, for example, an insulating material such as silicon oxide, silicon nitride, silicon oxynitride, silicon nitride oxide, or fluoride-doped silicate. The isolation layer 103 may define a plurality of active regions 105 of the substrate 101. The plurality of active regions 105 may extend along a direction W.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, in the embodiment depicted, the plurality of word lines 113 may be disposed in the upper portions of the substrate 101. Each of the plurality of active regions 105 may intersect two of the plurality of word lines 113. The plurality of word lines 113 may include a plurality of word line insulating layers 115, a plurality of word line electrodes 117, and a plurality of word line capping layers 119.

With reference to FIGS. 1 and 2, in the embodiment depicted, the plurality of word line insulating layers 115 may be inwardly disposed in the upper portions of the substrate 101. Thicknesses of the plurality of word line insulating layers 115 may be between about 0.5 nm and about 10 nm. Bottoms of the plurality of word line insulating layers 115 may be flat. The plurality of word line insulating layers 115 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like.

With reference to FIGS. 1 and 2, in the embodiment depicted, the plurality of word line electrodes 117 may be respectively correspondingly disposed on the plurality of word line insulating layers 115. The plurality of word line electrodes 117 may be formed of a conductive material such as polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. Thicknesses of the plurality of word line electrodes 117 may be between about 50 nm and about 500 nm.

With reference to FIGS. 1 and 2, in the embodiment depicted, the plurality of word line capping layers 119 may be respectively correspondingly disposed on the plurality of word line electrodes 117. Top surfaces of the plurality of word line capping layers 119 may be even with a top surface of the substrate 101. The plurality of word line capping layers 119 may be formed of a single layer including an insulating material having a dielectric constant of about 4.0 or greater. Alternatively, in another embodiment, each of the plurality of word line capping layers 119 may be formed of stacked layers including a bottom capping layer disposed on the corresponding word line electrode 117 and a top capping layer disposed on the bottom capping layer. The bottom capping layer may be formed of an insulating material having a dielectric constant of about 4.0 or greater. A top surface of the top capping layer may be even with the top surface of the substrate 101. The top capping layer may be formed of a low dielectric-constant material such as silicon oxide, silicon nitride, silicon oxynitride, silicon nitride oxide, fluoride-doped silicate, or the like. The top capping layer formed of the low dielectric-constant is material may reduce electric field at the top surface of the substrate 101; therefore, leakage current may be reduced.

With reference to FIGS. 1 and 2, in the embodiment depicted, for each of the plurality of active regions 105, the first doped region 109 may be disposed between the two of the plurality of word lines 113. The second doped regions 111 may be respectively disposed between the two of the plurality of word lines 113 and the isolation layer 103. The first doped region 109 and the second doped regions 111 may be doped with a dopant such as phosphorus, arsenic, or antimony.

With reference to FIGS. 1 and 2, in the embodiment depicted, the plurality of insulating films may include a first insulating film 401, a second insulating film 403, a third insulating film 405, a fourth insulating film 407, a plurality of supporting structures 411, a sixth insulating film 413, and a seventh insulating film 415. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. The first insulating film 401 may be disposed on the substrate 101. The plurality of insulating films may be all formed of a same material, but are not limited thereto.

With reference to FIGS. 1 and 2, in the embodiment depicted, the plurality of contacts may be disposed in the first insulating film 401. For each of the plurality of active regions 105, the plurality of contacts may include a first contact 123 and two second contacts 125. The first contact 123 may be disposed above the first doped region 109 and electrically connected to the first doped region 109. The two second contacts 125 may be respectively correspondingly disposed above the second doped regions 111 and electrically connected to the second doped regions 111. The first contact 123 and the two second contacts 125 may be formed of a conductive material such as doped polysilicon, metal, metal nitride, or metal silicide.

With reference to FIGS. 1 and 2, in the embodiment depicted, the second insulating film 403 may be disposed on the first insulating film 401. The plurality of bit line contacts 127 may be disposed in the second insulating film 403 and in the plurality of active regions 105. For each of the plurality of active regions 105, the bit line contact 127 may be disposed on the first contact 123 and electrically connected to the first contact 123. The plurality of bit line contacts 127 may be formed of a same material as the first contact 123, but are not limited thereto.

With reference to FIGS. 1 and 2, in the embodiment depicted, the third insulating film 405 may be disposed on the second insulating film 403. The plurality of bit lines 129 may be disposed in the third insulating film 405. For each of the plurality of active regions 105, the bit line 129 may be disposed on the plurality of bit line contacts 127 and electrically connected to the plurality of bit line contacts 127. The plurality of bit lines 129 may be formed of a conductive material such as tungsten, aluminum, copper, nickel, or cobalt.

With reference to FIGS. 1 and 2, in the embodiment depicted, the fourth insulating film 407 may be disposed on the third insulating film 405. The plurality of plugs 131 may be disposed penetrating through the fourth insulating film 407, the third insulating film 405, and the second insulating film 403. For each of the plurality of active regions 105, two of the plurality of plugs 131 may be respectively correspondingly disposed on the two second contacts 125 and electrically connected to the two second contacts 125. The plurality of plugs 131 may be formed of doped polysilicon, titanium, titanium nitride, tantalum, tantalum nitride, tungsten, copper, aluminum or aluminum alloy.

With reference to FIGS. 1 and 2, in the embodiment depicted, the capacitor structure 301 may be disposed on the fourth insulating film 407 and electrically connected to the plurality of plugs 131. The capacitor structure 301 may include a plurality of capacitor bottom electrodes 303, a capacitor insulating layer 305, and a capacitor top electrode 307. The plurality of capacitor bottom electrodes 303 may be inwardly disposed on the fourth insulating film 407. Bottoms of the plurality of capacitor bottom electrodes 303 may directly contact top surfaces of the plurality of plugs 131. The plurality of capacitor bottom electrodes 303 may be formed of doped polysilicon, metal, or metal silicide.

With reference to FIGS. 1 and 2, in the embodiment depicted, the plurality of supporting structures 411 may be disposed on the fourth insulating film 407. The plurality of supporting structures 411 may be partially attached to outer surfaces of the plurality of capacitor bottom electrodes 303. Some of the plurality of supporting structures 411 may extend along the direction W and may be separated from each other. Others of the plurality of supporting structures 411 may extend along a direction X and may be separated from each other.

With reference to FIGS. 1 and 2, in the embodiment depicted, the capacitor insulating layer 305 may be disposed over the plurality of capacitor bottom electrodes 303 and the plurality of supporting structures 411. The capacitor insulating layer 305 may be formed of a single layer including an insulating material having a dielectric constant of about 4.0 or greater. A thickness of the capacitor insulating layer 305 may be between about 1 angstrom and about 100 angstroms. Alternatively, in another embodiment, the capacitor insulating layer 305 may be formed of a stacked layer consisting of silicon oxide, silicon nitride, and silicon oxide. The capacitor top electrode 307 may be disposed over the capacitor insulating layer 305. The capacitor top electrode 307 may be formed of doped polysilicon or metal.

With reference to FIGS. 1 and 2, in the embodiment depicted, the sixth insulating film 413 may be disposed on the capacitor top electrode 307. The seventh insulating film 415 may be disposed on the sixth insulating film 413. The plurality of conductive elements may be disposed among the sixth insulating film 413 and the seventh insulating film 415. The plurality of conductive elements may include a first via 501 and a first conductive line 503. The first via 501 may be disposed in the sixth insulating film 413. The first via 501 may be disposed on the capacitor top electrode 307 and electrically connected to the capacitor top electrode 307. The first via 501 may be formed of for example, metal, metal alloy, silicate, silicide, polysilicon, amorphous silicon, or any other semiconductor-compatible conductive material. The first conductive line 503 may be disposed in the seventh insulating film 415. The first conductive line 503 may be disposed on the first via 501 and electrically connected to the first via 501. The first conductive line 503 may be formed of a conductive material such as doped polysilicon, metal, metal nitride, or metal silicide.

With reference to FIGS. 1 and 2, in the embodiment depicted, the plurality of passivation layers may be disposed on the seventh insulating film 415. The plurality of passivation layers may include a first passivation layer 601, a second passivation layer 603, a third passivation layer 605, and a fourth passivation layer 607. The first passivation layer 601 may be disposed on the seventh insulating film 415 and formed of, for example, silicon oxide or phosphosilica glass. The second passivation layer 603 may be disposed on the first passivation layer 601 and formed of, for example, silicon nitride, silicon oxynitride, or silicon oxide nitride. The first passivation layer 601 may serve as a stress buffer between the second passivation layer 603 and the seventh insulating film 415. The second passivation layer 603 may serve as a high vapor barrier in order to prevent moisture from entering from above. The third passivation layer 605 may be disposed on the second passivation layer 603 and formed of, for example, silicon oxide or phosphosilica glass. The fourth passivation layer 607 may be disposed on the third passivation layer 605 and formed of, for example, polyimide or polyamide. The fourth passivation layer 607 may protect the layers below the fourth passivation layer 607 from mechanical scratches or background radiation.

With reference to FIGS. 1 and 2, in the embodiment depicted, the pad structure 611 may be disposed in the third passivation layer 605, the second passivation layer 603, and the first passivation layer 601. The pad structure 611 may be disposed above the first conductive line 503 and electrically connected to the first conductive line 503. Alternatively, in another embodiment, the pad structure 611 may be disposed at a vertical level higher than a vertical level of the first conductive line 503 and electrically coupled to the first conductive line 503. The pad structure 611 may include a pad bottom conductive layer 613 and a pad top conductive layer 615.

With reference to FIGS. 1 and 2, in the embodiment depicted, the pad bottom conductive layer 613 may be disposed in the first passivation layer 601 and on the first conductive line 503. The pad bottom conductive layer 613 may be electrically coupled to the first conductive line 503. A thickness of the pad bottom conductive layer 613 may be less than a thickness of the first passivation layer 601. The pad bottom conductive layer 613 may include nickel. The pad top conductive layer 615 may be disposed in the second passivation layer 603 and the third passivation layer 605. The pad top conductive layer 615 may be disposed on the pad bottom conductive layer 613 and electrically connected to the pad bottom conductive layer 613. A top surface of the pad top conductive layer 615 may be even with a top surface of the third passivation layer 605. The pad top conductive layer 615 may include palladium, cobalt, or a combination thereof.

With reference to FIGS. 1 and 2, in the embodiment depicted, the bonding opening 609 may be disposed in the fourth passivation layer 607 and above the pad top conductive layer 615. In other words, the top surface of the pad top conductive layer 615 may be exposed through the bonding opening 609. A width W1 of the bonding opening 609 may be less than a width W2 of the pad top conductive layer 615.

Figure 3:
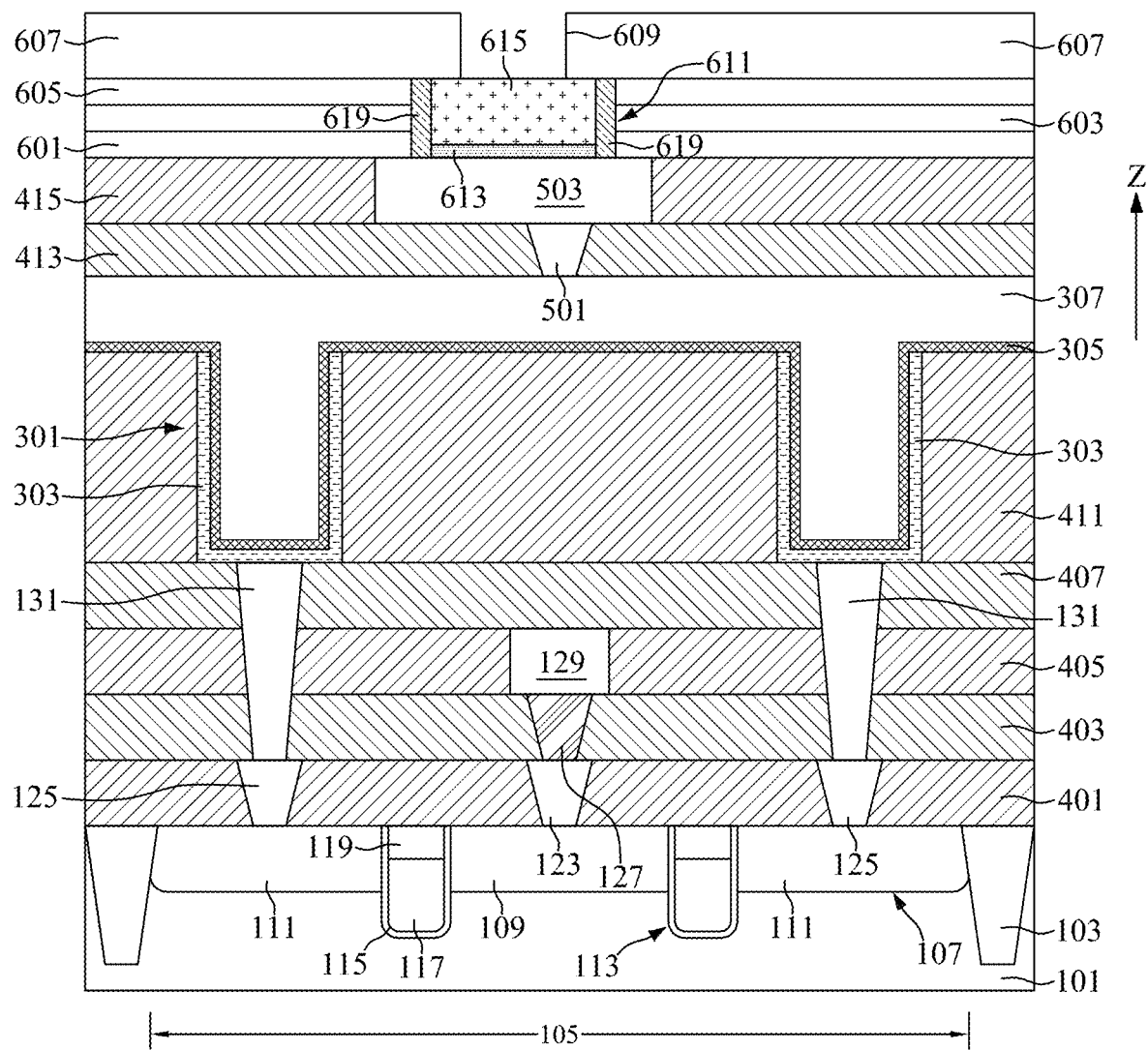
FIGS. 3 to 5 illustrate, in schematic cross-sectional view diagrams, some semiconductor devices in accordance with other embodiments of the present disclosure.
Figure 4:
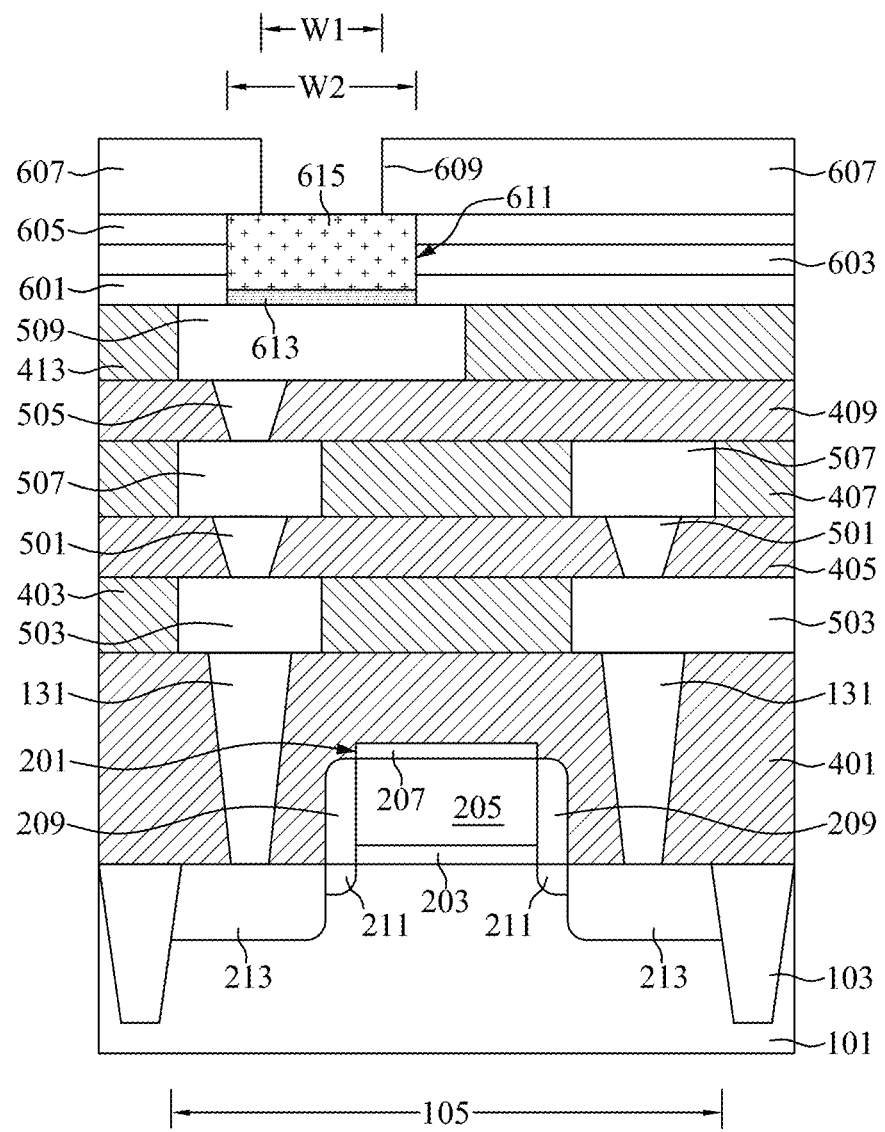
Figure 5:
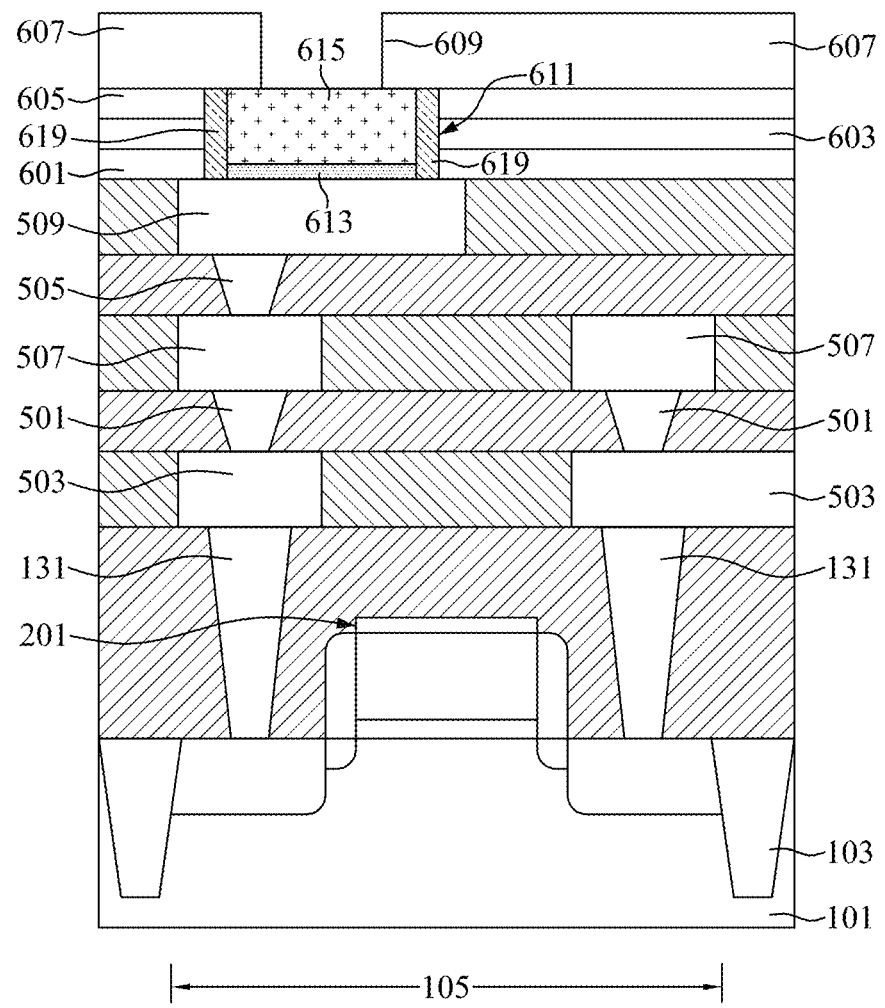

FIGS. 3 to 5 illustrate, in schematic cross-sectional view diagrams, some semiconductor devices in accordance with other embodiments of the present disclosure.

With reference to FIG. 3, the semiconductor device may further include spacers 619. The spacers 619 may be attached to two sides of the pad structure 611. In other words, the spacers 619 may be disposed between the pad structure 611 and the first passivation layer 601, the second passivation layer 603, and the third passivation layer 605. The spacers 619 may be formed of, for example, silicon oxide.

With reference to FIG. 4, in another embodiment, a semiconductor device may include a substrate 101, an isolation layer 103, a gate structure 201, a plurality of gate spacers 209, a plurality of lightly-doped regions 211, a plurality of heavily-doped regions 213, a plurality of insulating films, a plurality of plugs 131, a plurality of conductive elements, a plurality of passivation layers, a bonding opening 609, and a pad structure 611.

With reference to FIG. 4, the isolation layer 103 may be disposed in the substrate 101 and define a plurality of active regions 105 (only one active region 105 is shown in the cross-sectional view diagram). The gate structure 201 may be disposed on the substrate 101. The gate structure 201 may include a gate bottom layer 203, a gate middle layer 205, and a gate top layer 207.

With reference to FIG. 4, the gate bottom layer 203 may be disposed on the substrate 101 and formed of, for example, silicon oxide, silicon oxynitride, silicon nitride oxide, silicon nitride, or the like. The gate middle layer 205 may be disposed on the gate bottom layer 203 and formed of, for example, doped polysilicon. The gate top layer 207 may be disposed on the gate middle layer 205 and formed of metal silicide such as nickel silicide, platinum silicide, titanium silicide, molybdenum silicide, cobalt silicide, tantalum silicide, tungsten silicide, or the like.

With reference to FIG. 4, the plurality of gate spacers 209 may be attached to sidewalls of the gate structure 201. Specifically, the plurality of gate spacers 209 may be attached to sidewalls of the gate bottom layer 203 and sidewalls of the gate middle layer 205. The plurality of gate spacers 209 may be formed of, for example, silicon oxide, silicon nitride, or the like.

With reference to FIG. 4, the plurality of lightly-doped regions 211 may be disposed in the substrate 101 and respectively correspondingly adjacent to two sides of the gate bottom layer 203. Parts of the plurality of lightly-doped regions 211 may be disposed below the plurality of gate spacers 209. The plurality of lightly-doped regions 211 may be doped with a dopant such as phosphorus, arsenic, or antimony. Alternatively, in another embodiment, the dopant may be boron.

With reference to FIG. 4, the plurality of heavily-doped regions 213 may be disposed in the substrate 101 and respectively correspondingly adjacent to the plurality of lightly-doped regions 211. The plurality of heavily-doped regions 213 may be doped with a same dopant as the plurality of lightly-doped regions 211. A dopant concentration of the plurality of heavily-doped regions 213 may be greater than that of the plurality of lightly-doped regions 211.

With reference to FIG. 4, the plurality of insulating films may be disposed on the substrate 101. The plurality of insulating films may be stacked films including, from bottom to top, a first insulating film 401, a second insulating film 403, a third insulating film 405, a fourth insulating film 407, a fifth insulating film 409, and a sixth insulating film 413. The first insulating film 401 may cover the gate structure 201 and the plurality of gate spacers 209. The plurality of plugs 131 may be disposed in the first insulating film 401. The plurality of plugs 131 may be respectively correspondingly disposed on the plurality of heavily-doped regions 213 and electrically connected to the plurality of heavily-doped regions 213.

With reference to FIG. 4, the plurality of conductive elements may be disposed among the plurality of insulating films. The plurality of conductive elements may include a plurality of first vias 501, a plurality of conductive lines 503, a second via 505, a plurality of second conductive lines 507, and a third conductive line 509. The plurality of conductive lines 503 may be disposed in the second insulating film 403. The plurality of conductive lines 503 may be respectively correspondingly disposed on the plurality of plugs 131 and electrically connected to the plurality of plugs 131.

With reference to FIG. 4, the plurality of first vias 501 may be disposed in the third insulating film 405. The plurality of first vias 501 may be respectively correspondingly disposed on the plurality of conductive lines 503 and electrically connected to the plurality of conductive lines 503. The plurality of second conductive lines 507 may be respectively correspondingly disposed on the plurality of first vias 501 and in the fourth insulating film 407. The plurality of second conductive lines 507 may be electrically connected to the plurality of first vias 501. The second via 505 may be disposed on one of the plurality of second conductive lines 507 and in the fifth insulating film 409. The second via 505 may be electrically connected to the one of the plurality of second conductive lines 507. The third conductive line 509 may be disposed on the second via 505 and in the sixth insulating film 413. The third conductive line 509 may be electrically connected to the second via 505. It should be noted that the number of the conductive elements and the number of layers of insulating films are given for illustrative purposes only, and may be set to arbitrary values depending on the requirements of a particular application.

With reference to FIG. 4, the plurality of passivation layers may be disposed on the sixth insulating film 413. The plurality of passivation layers may include, from bottom to top, a first passivation layer 601, a second passivation layer 603, a third passivation layer 605, and a fourth passivation layer 607. The pad structure 611 may be disposed in the first passivation layer 601, the second passivation layer 603, and the third passivation layer 605. The pad structure 611 may be disposed on the third conductive line 509. The pad structure 611 may include a pad bottom conductive layer 613 and a pad top conductive layer 615. The pad bottom conductive layer 613 may be disposed in the first passivation layer 601 and on the third conductive line 509. The pad bottom conductive layer 613 may include nickel and may be electrically connected to the third conductive line 509. The pad top conductive layer 615 may be disposed on the pad bottom conductive layer 613. The pad top conductive layer 615 may include palladium, cobalt, or a combination thereof and may be electrically connected to the pad bottom conductive layer 613. A top surface of the pad top conductive layer 615 may be even with a top surface of the third passivation layer 605.

With reference to FIG. 4, the bonding opening 609 may be disposed in the fourth passivation layer 607. Part of the top surface of the pad top conductive layer 615 may be exposed through the bonding opening 609. A width W1 of the bonding opening 609 may be less than a width W2 of the pad top conductive layer 615.

With reference to FIG. 5, the semiconductor device may include spacers 619. The spacers 619 may be attached to two sides of the pad structure 611, similar to the configuration shown in FIG. 3.

Figure 6:
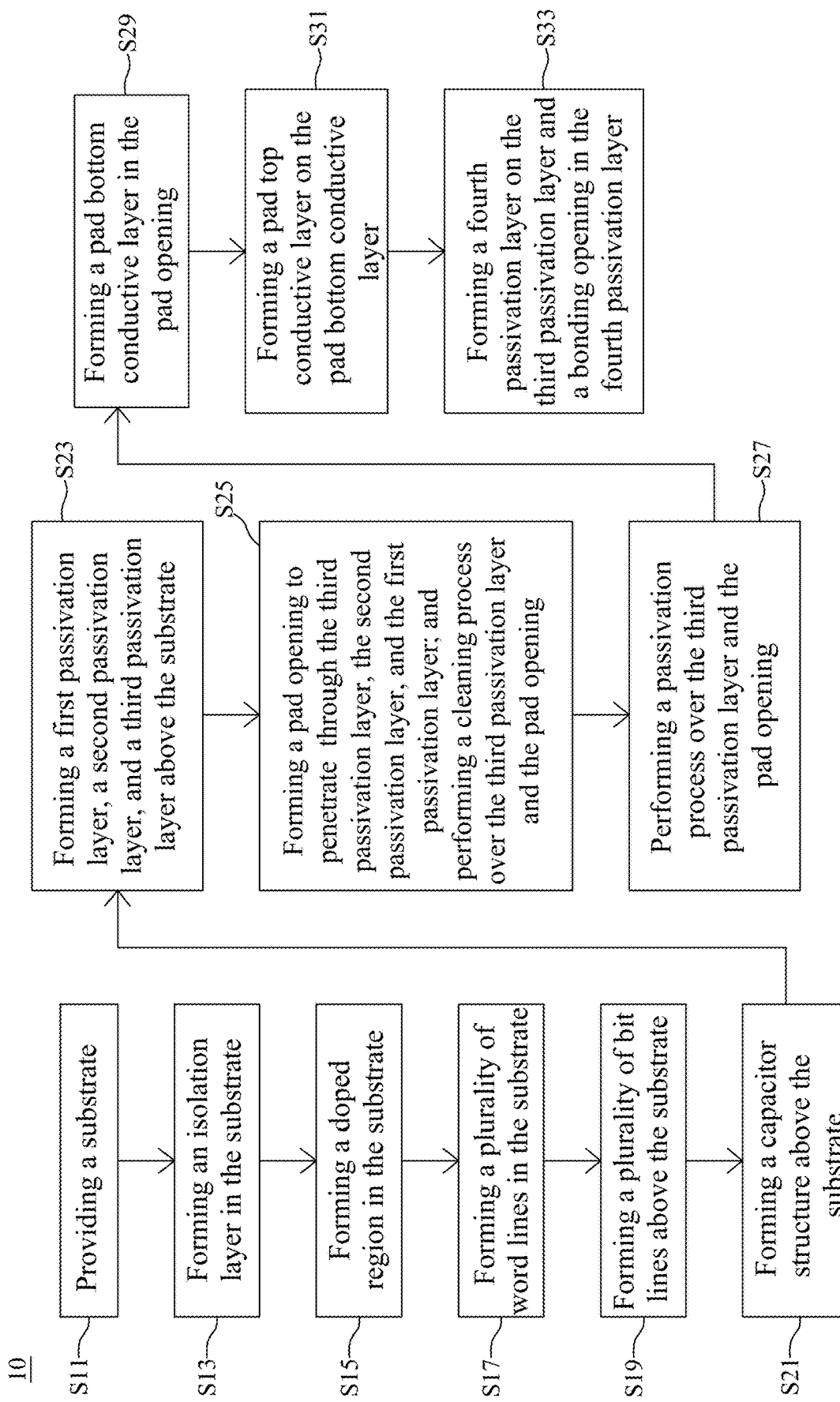
FIG. 6 illustrates, in a flowchart diagram form, a method for fabricating a semiconductor device in accordance with one embodiment of the present disclosure.
Figure 7:
FIGS. 7 and 8 illustrate, in schematic cross-sectional diagrams, part of a flow of fabricating a semiconductor device in accordance with one embodiment of the present disclosure.
Figure 8:
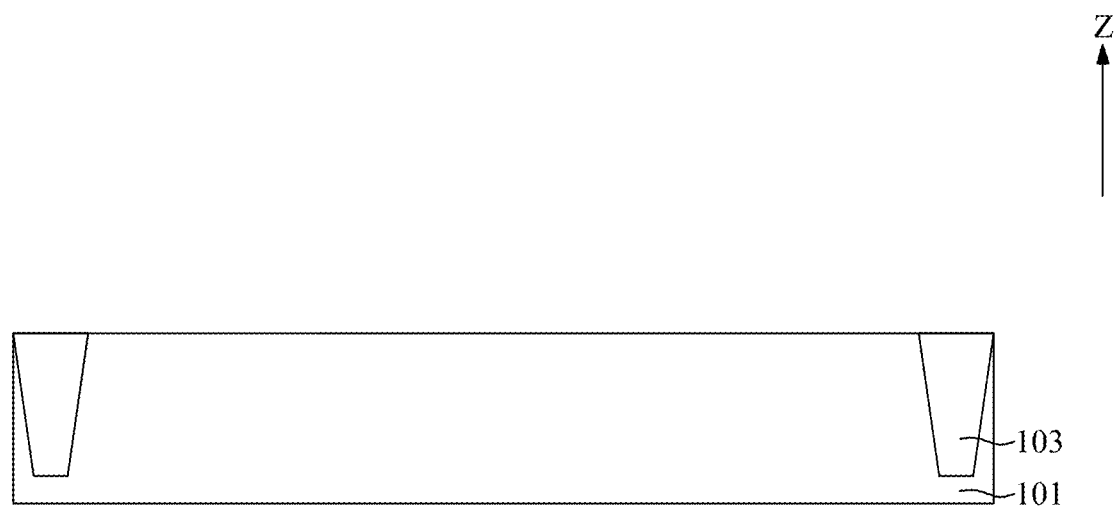
Figure 9:
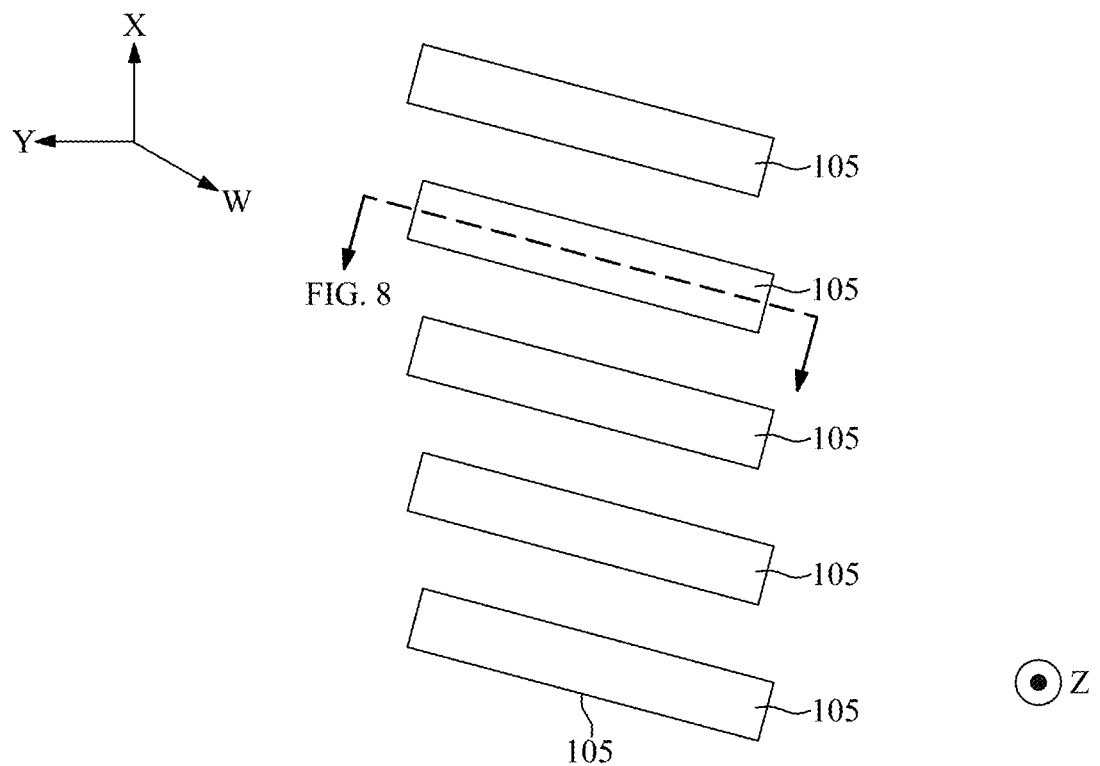
FIG. 9 illustrates, in a schematic top-view diagram, the semiconductor device in accordance with FIG. 8.
Figure 10:
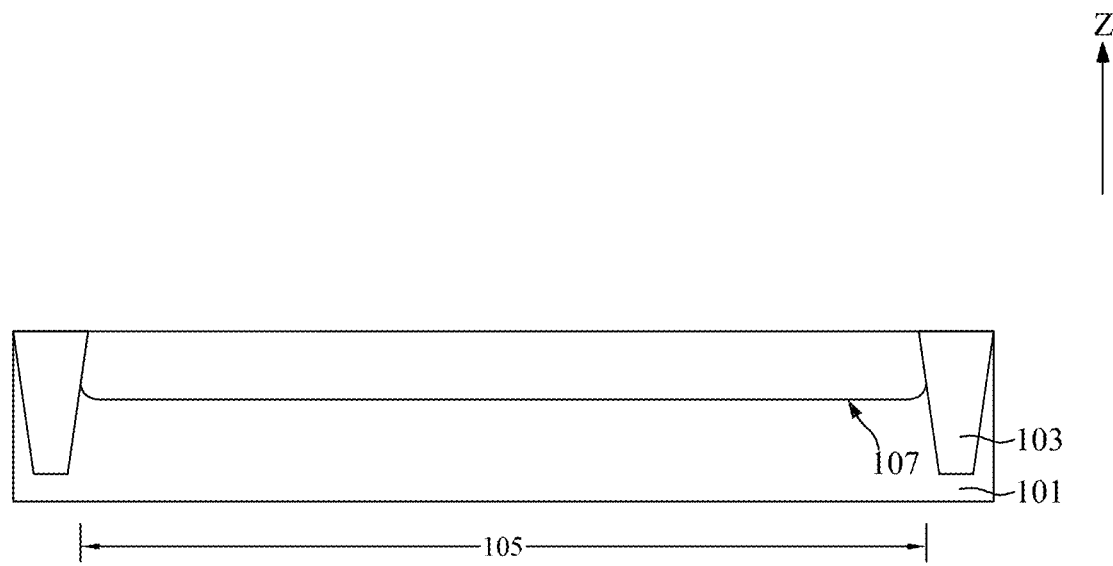
FIG. 10 illustrates, in a schematic cross-sectional diagram, part of the flow of fabricating a semiconductor device in accordance with one embodiment of the present disclosure.
Figure 11:
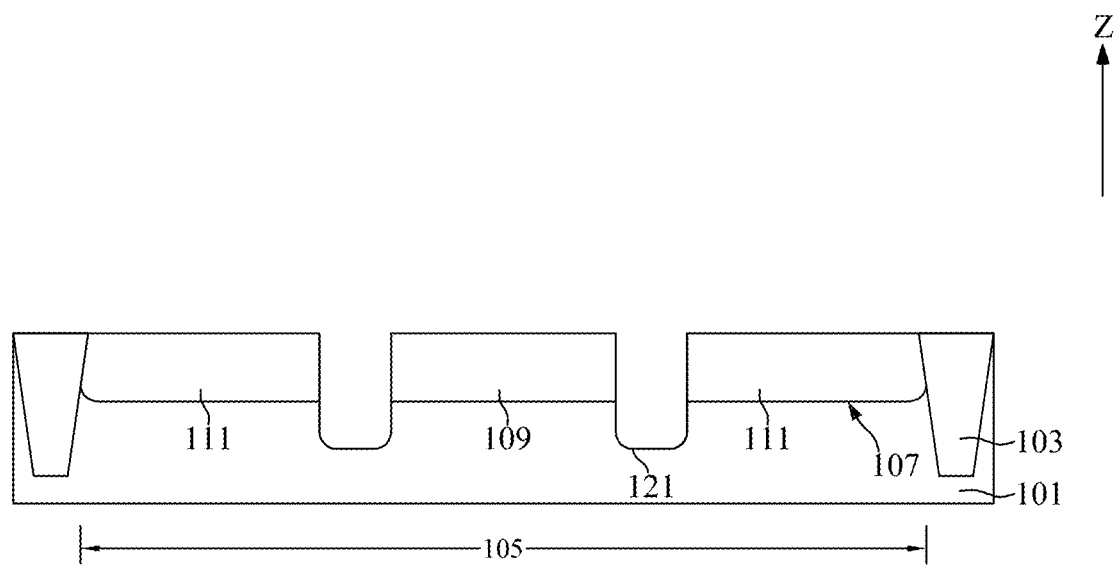
FIGS. 11 to 14 illustrate, in schematic cross-sectional diagrams, part of a flow of fabricating a semiconductor device in accordance with one embodiment of the present disclosure.
Figure 12:
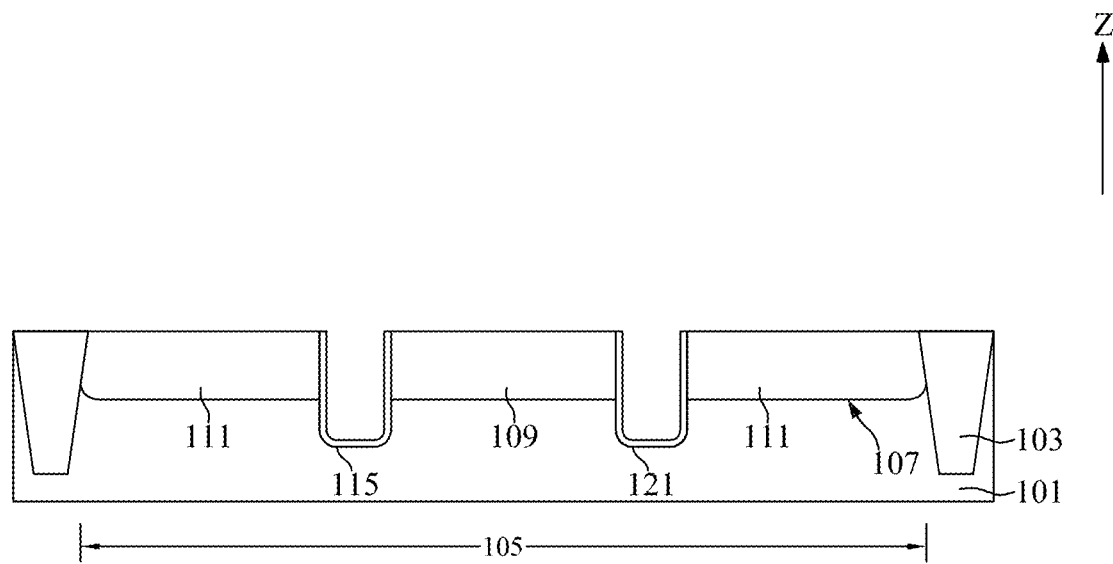
Figure 13:
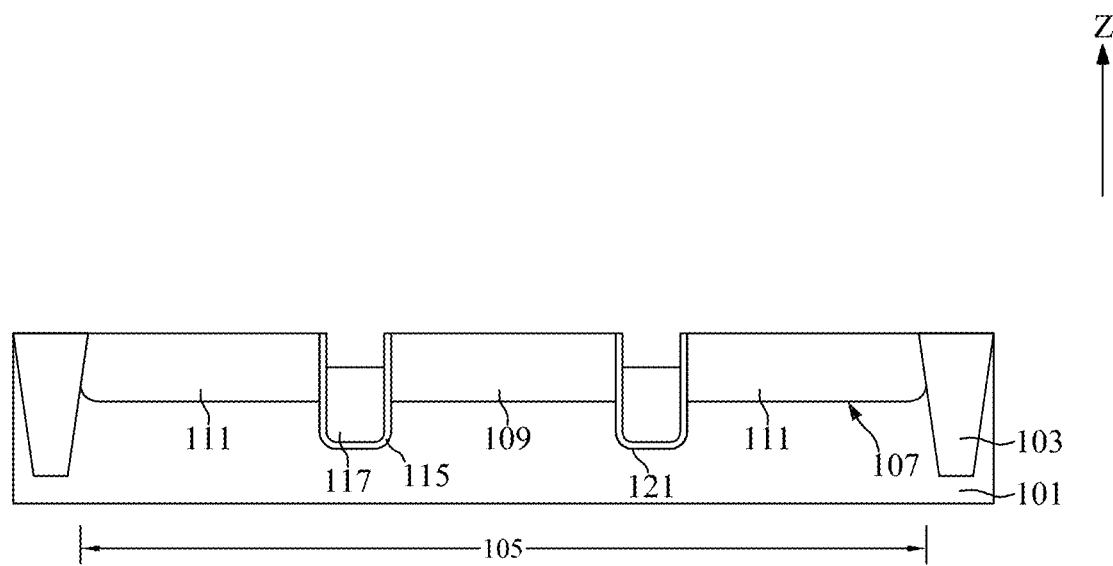
Figure 14:
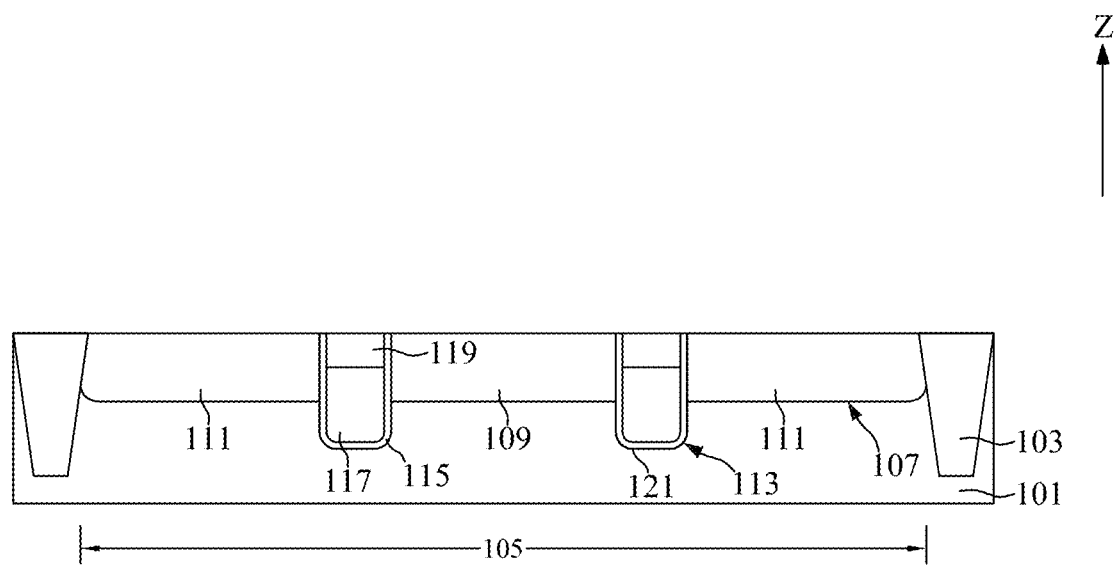

FIG. 6 illustrates, in a flowchart diagram form, a method 10 for fabricating a semiconductor device in accordance with one embodiment of the present disclosure. FIGS. 7 and 8 illustrate, in schematic cross-sectional diagrams, part of a flow of fabricating a semiconductor device in accordance with one embodiment of the present disclosure. FIG. 9 illustrates, in a schematic top-view diagram, the semiconductor device in accordance with FIG. 8. FIG. 10 illustrates, in a schematic cross-sectional diagram, part of the flow of fabricating a semiconductor device in accordance with one embodiment of the present disclosure. Some elements of the semiconductor device of the present disclosure are not shown in FIG. 9 for clarity.

With reference to FIGS. 6 and 7, at step S11, in the embodiment depicted, a substrate 101 may be provided. With reference to FIGS. 6, 8 and 9, at step S13, in the embodiment depicted, an isolation layer 103 may be formed in the substrate 101 and may define a plurality of active regions 105. The plurality of active regions 105 may extend along a direction W. With reference to FIGS. 6 and 10, at step S15, in the embodiment depicted, a doped region 107 may be formed in the plurality of active regions 105. The doped region 107 may be doped with a dopant such as phosphorus, arsenic, or antimony.

Figure 15:
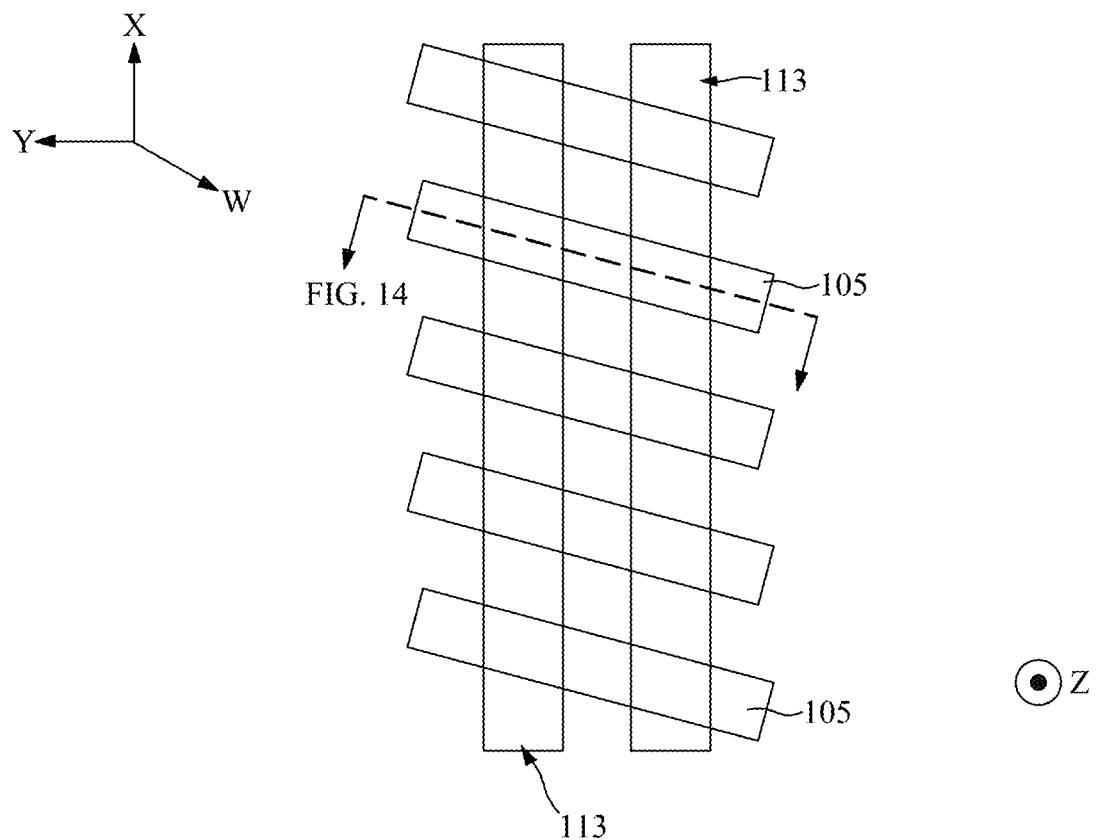
FIG. 15 illustrates, in a schematic top-view diagram, the semiconductor device in accordance with FIG. 14.

FIGS. 11 to 14 illustrate, in schematic cross-sectional diagrams, part of a flow of fabricating a semiconductor device in accordance with one embodiment of the present disclosure. FIG. 15 illustrates, in a schematic top-view diagram, the semiconductor device in accordance with FIG. 14. Some elements of the semiconductor device of the present disclosure are not shown in FIG. 15 for clarity.

With reference to FIGS. 6 and 11 to 15, at step S17, in the embodiment depicted, a plurality of word lines 113 may be formed in the substrate 101. The plurality of word lines 113 may include a plurality of word line insulating layers 115, a plurality of word line electrodes 117, and a plurality of word line capping layers 119. The plurality of word lines 113 may extend along a direction X and may be separated from each other. The direction W may be diagonal with respect to the direction X. The plurality of word lines 113 may intersect the plurality of active regions 105. Each of the plurality of active regions 105 may intersect two of the plurality of word lines 113. For each of the plurality of active regions 105, the doped region 107 may be divided by the two of the plurality of word lines 113 to form a first doped region 109 and second doped regions 111. The first doped region 109 may be disposed between the two of the plurality of word lines 113. The second doped regions 111 may be respectively disposed at two ends of each of the plurality of active regions 105.

With reference to FIGS. 11 to 14, a plurality of word line trenches 121 may be inwardly formed in the substrate 101. The plurality of word line insulating layers 115 may be subsequently formed in the plurality of word line trenches 121. The plurality of word line electrodes 117 may be formed on the plurality of word line insulating layers 115. The plurality of word line capping layers 119 may be formed on the plurality of word line electrodes 117. A planarization process, such as chemical mechanical polishing, may be performed to provide a substantially flat surface for subsequent processing steps.

Figure 16:
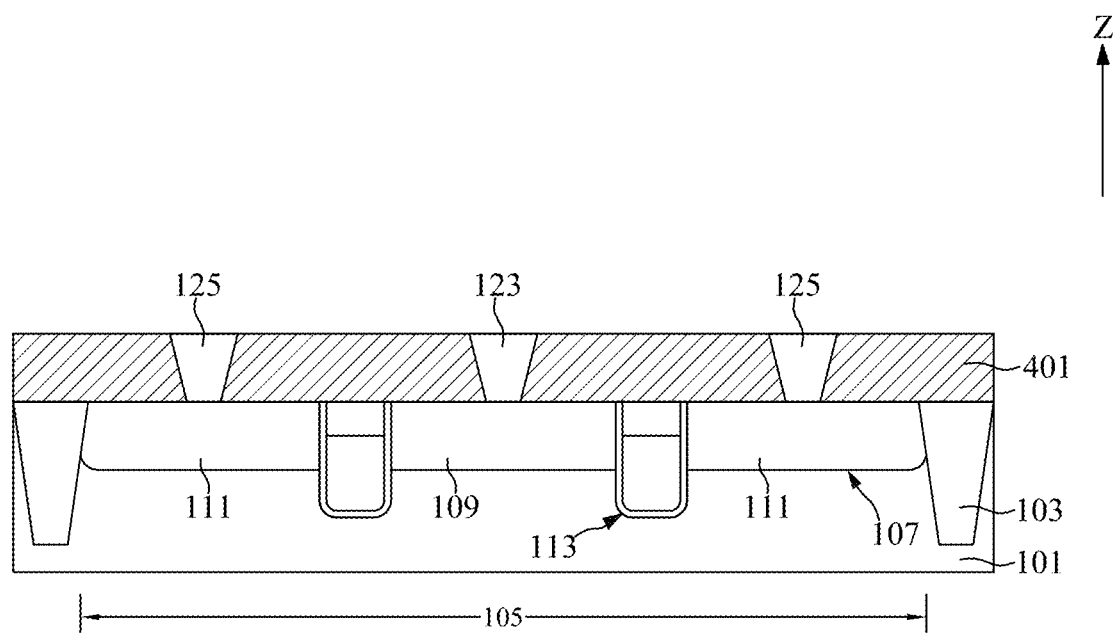
FIGS. 16 and 17 illustrate, in schematic cross-sectional diagrams, part of a flow of fabricating a semiconductor device in accordance with one embodiment of the present disclosure.
Figure 17:
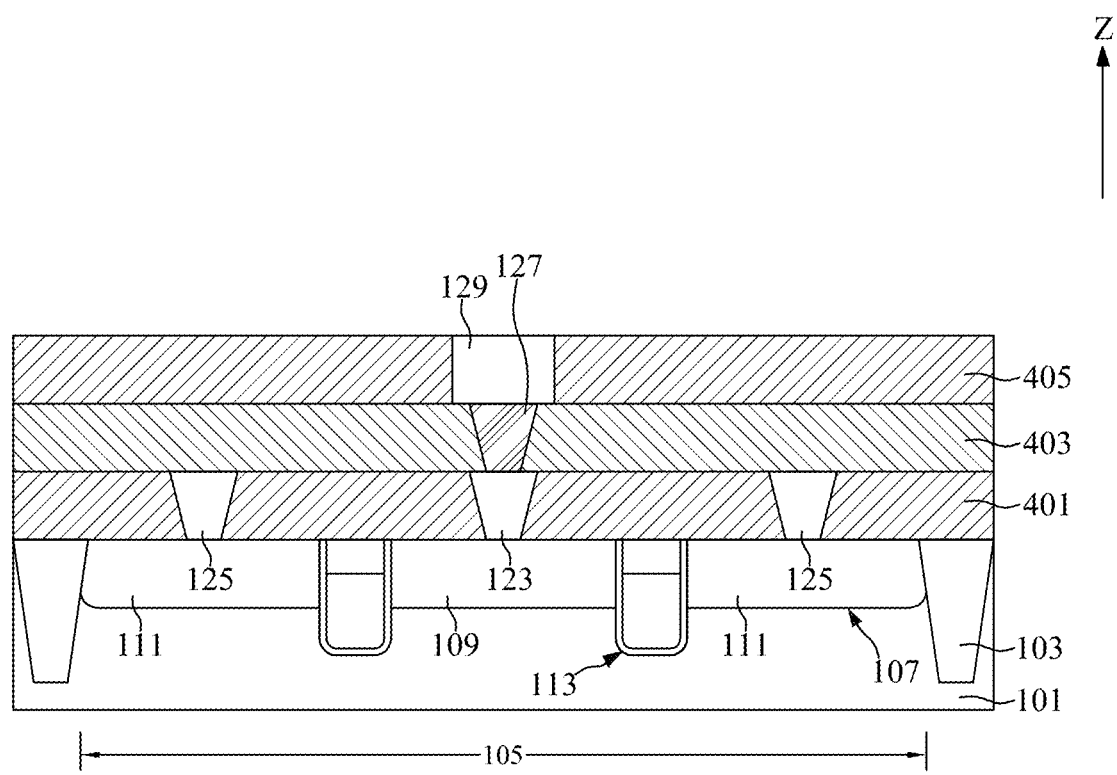
Figure 18:
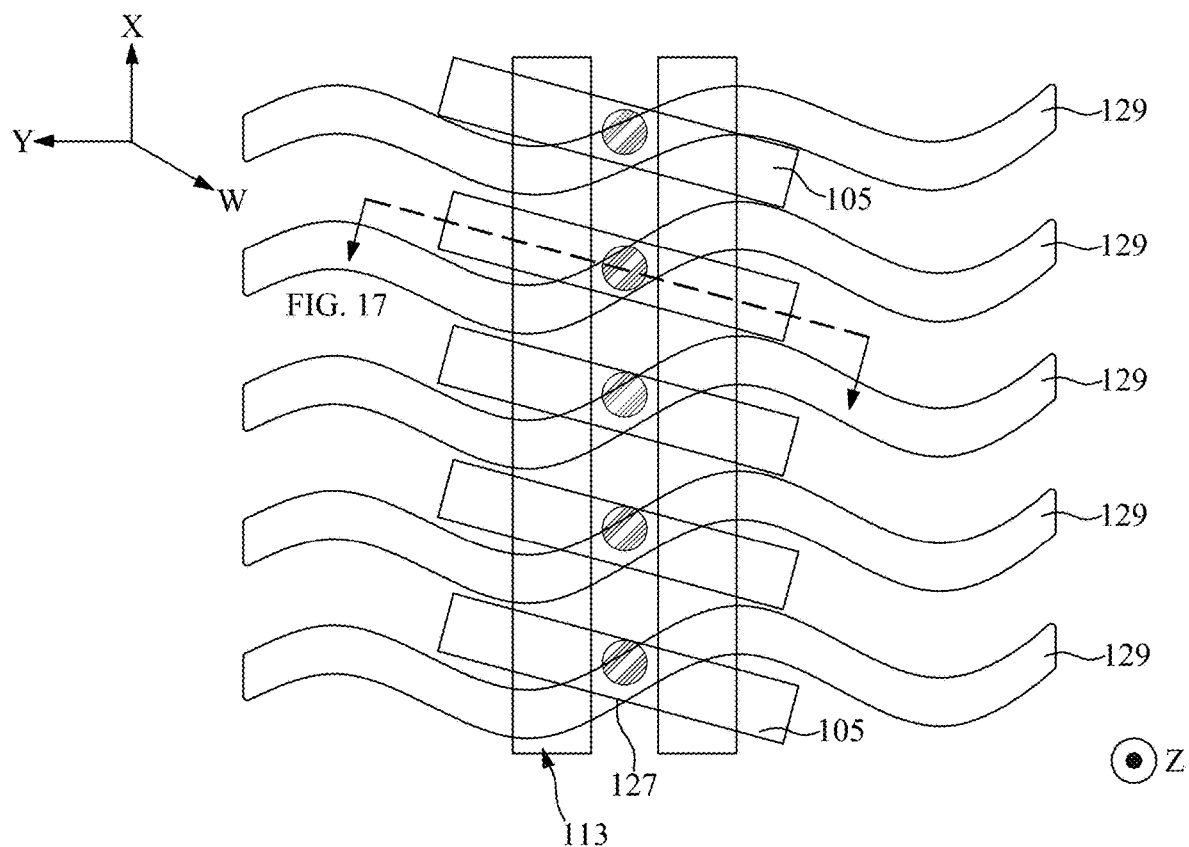
FIG. 18 illustrates, in a schematic top-view diagram, the semiconductor device in accordance with FIG. 17.

FIGS. 16 and 17 illustrate, in schematic cross-sectional diagrams, part of a flow of fabricating a semiconductor device in accordance with one embodiment of the present disclosure. FIG. 18 illustrates, in a schematic top-view diagram, the semiconductor device in accordance with FIG. 17. Some elements of the semiconductor device of the present disclosure are not shown in FIG. 18 for clarity.

With reference to FIGS. 6 and 16 to 18, at step S19, in the embodiment depicted, a plurality of bit lines 129 may be formed above the substrate 101. With reference to FIG. 16, a first insulating film 401 may be formed on the substrate 101. For each of the plurality of active regions 105, a first contact 123 and two second contacts 125 may be formed in the first insulating film 401. The first contact 123 may be formed on the first doped region 109. The two second contacts 125 may be respectively correspondingly formed on the second doped regions 111.

With reference to FIGS. 17 and 18, a second insulating film 403 may be formed on the first insulating film 401. A third insulating film 405 may be formed on the second insulating film 403. A plurality of bit line contacts 127 may be formed in the second insulating film 403. The plurality of bit line contacts 127 may be respectively correspondingly disposed on the plurality of first contacts 123. In other words, each of the plurality of bit line contacts 127 may be correspondingly disposed in a center of one of the plurality of active regions 105. A plurality of bit lines 129 may be formed in the third insulating film 405. The plurality of bit lines 129 may extend along a direction Y diagonal with respect to the direction W and perpendicular to the direction X. The plurality of bit lines 129 may be implemented as wavy lines. The plurality of bit lines 129 may be separated from each other. Each of the plurality of bit lines 129 may intersect one of the plurality of active regions 105 from a top view diagram. For each of the plurality of active regions 105, the bit line contact 127 may be located at the intersection of the corresponding bit line 129 and the corresponding active region 105. The plurality of bit lines 129 may be electrically connected to the plurality of bit line contacts 127.

Figure 19:
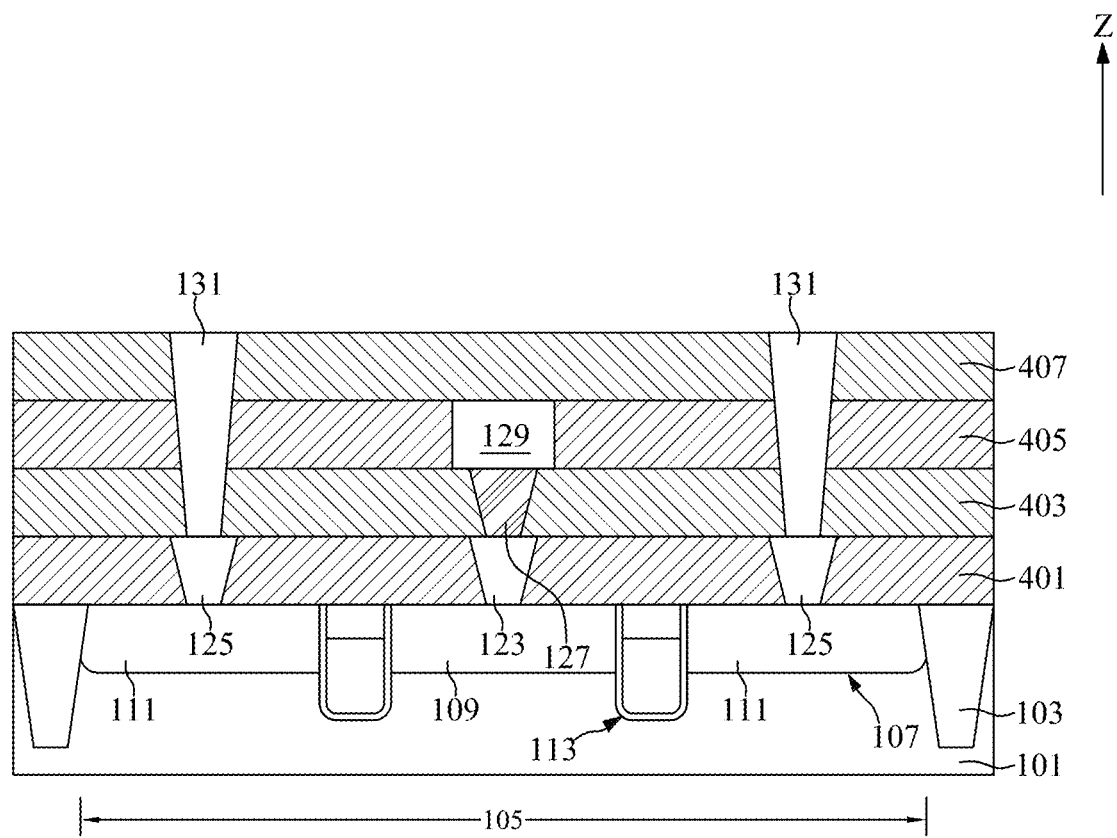
FIGS. 19 and 20 illustrate, in schematic cross-sectional diagrams, part of a flow of fabricating a semiconductor device in accordance with one embodiment of the present disclosure.
Figure 20:
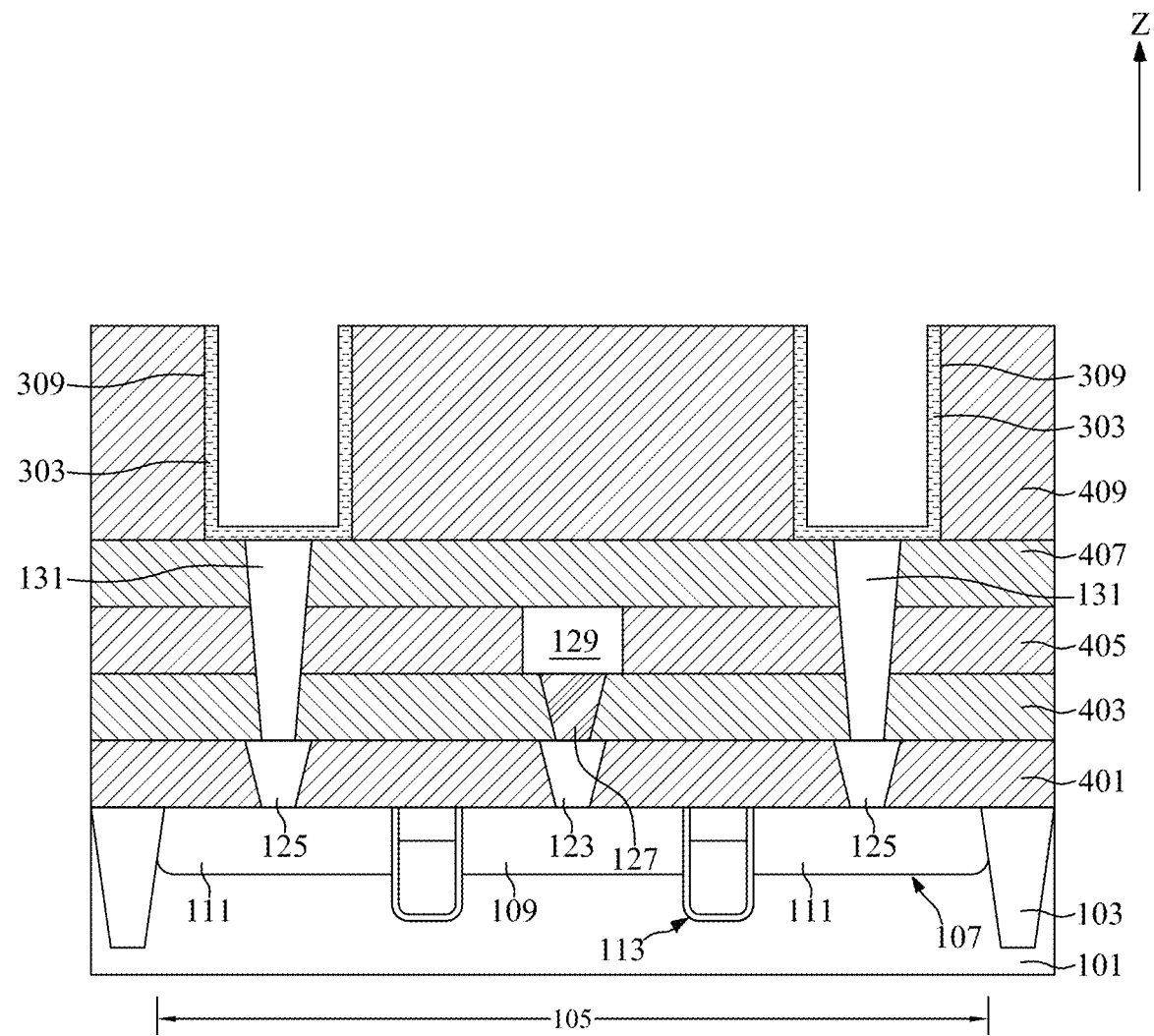
Figure 21:
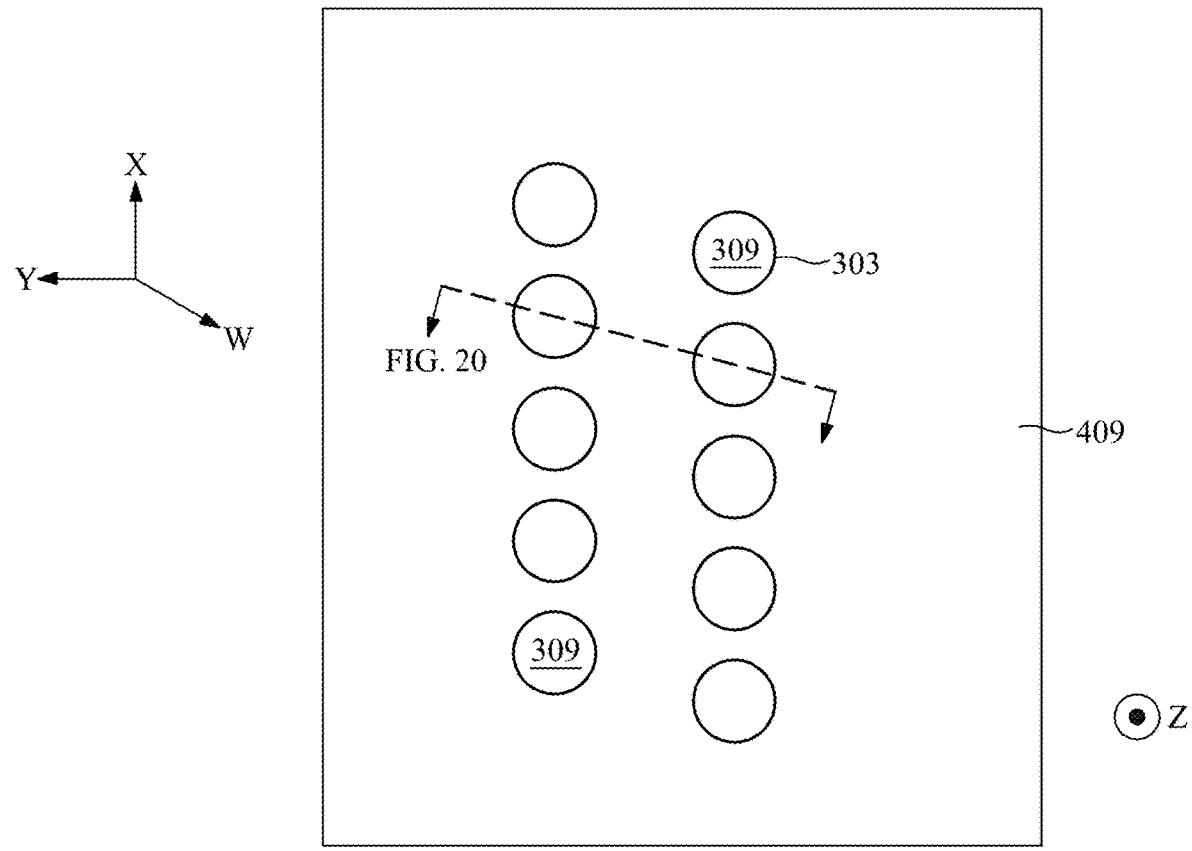
FIG. 21 illustrates, in a schematic top-view diagram, the semiconductor device in accordance with FIG. 20.
Figure 22:
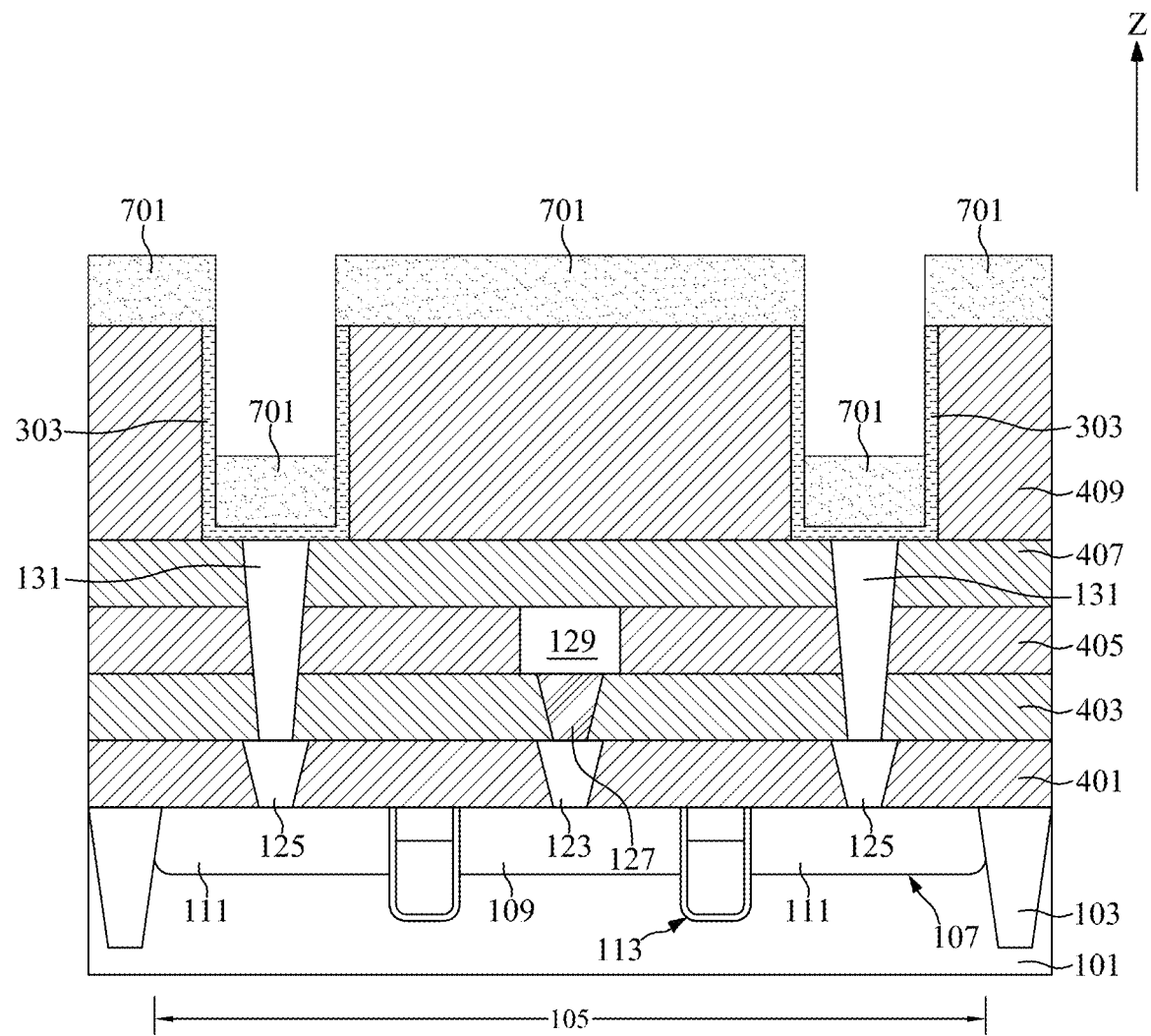
FIGS. 22 and 23 illustrate, in schematic cross-sectional diagrams, part of a flow of fabricating a semiconductor device in accordance with one embodiment of the present disclosure.
Figure 23:
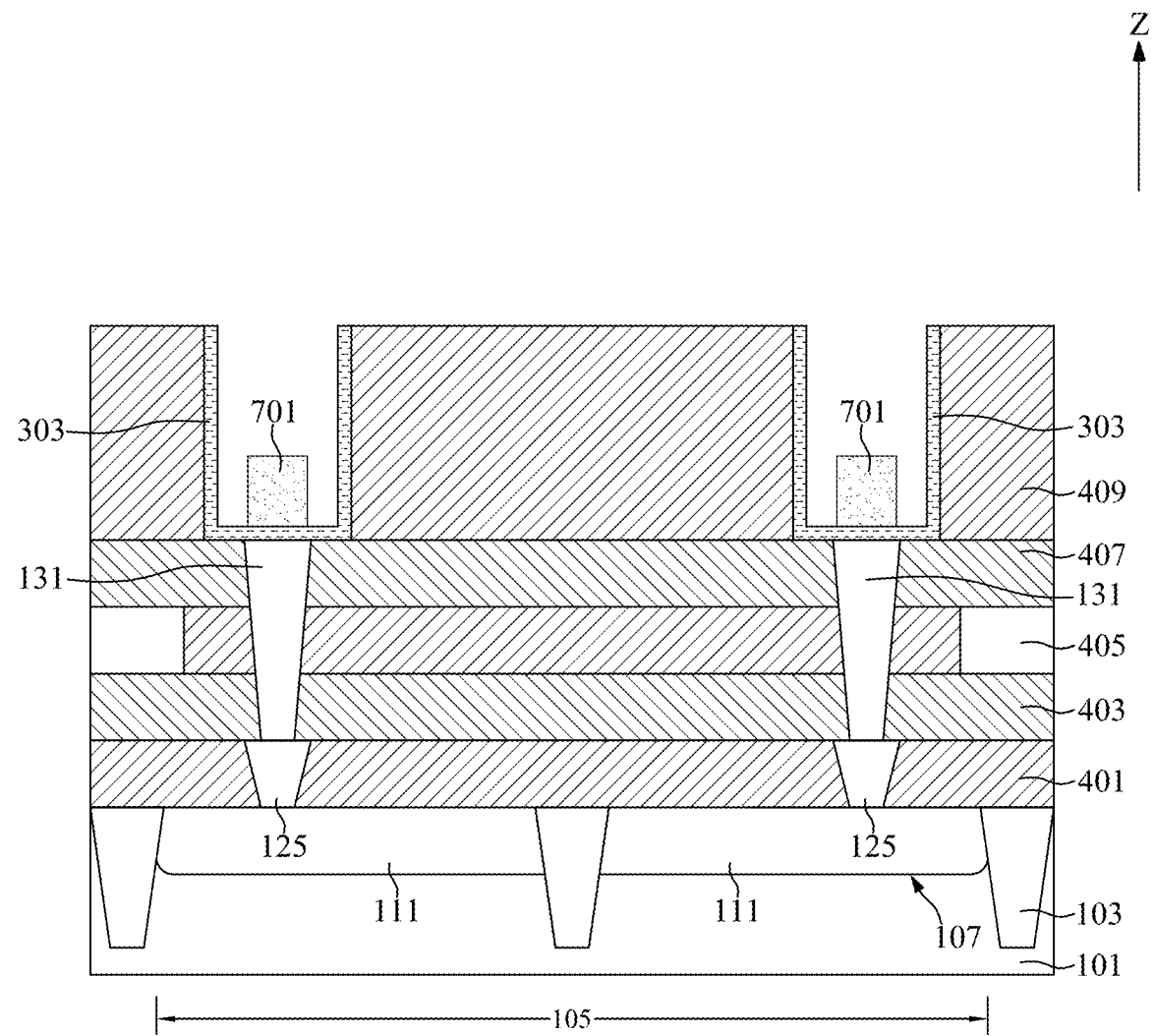
Figure 24:
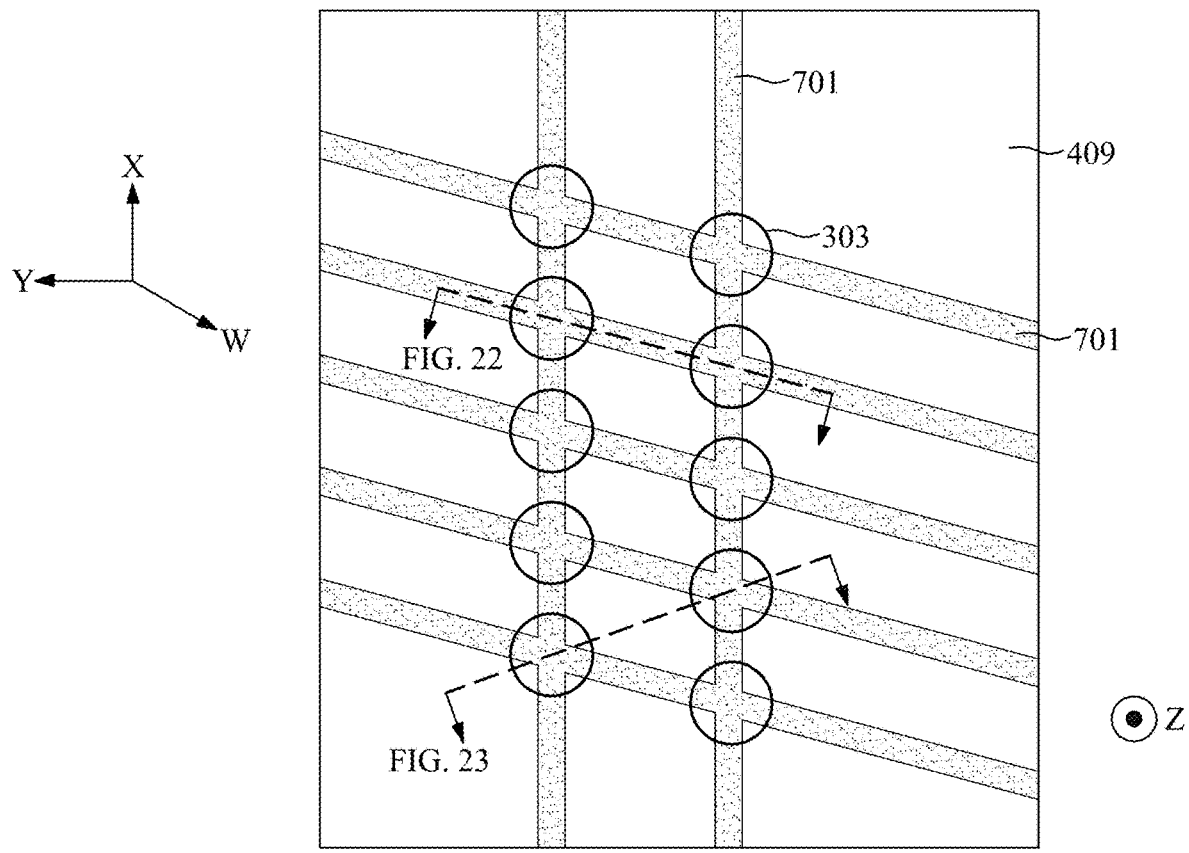
FIG. 24 illustrates, in a schematic top-view diagram, the semiconductor device in accordance with FIGS. 22 and 23.
Figure 25:
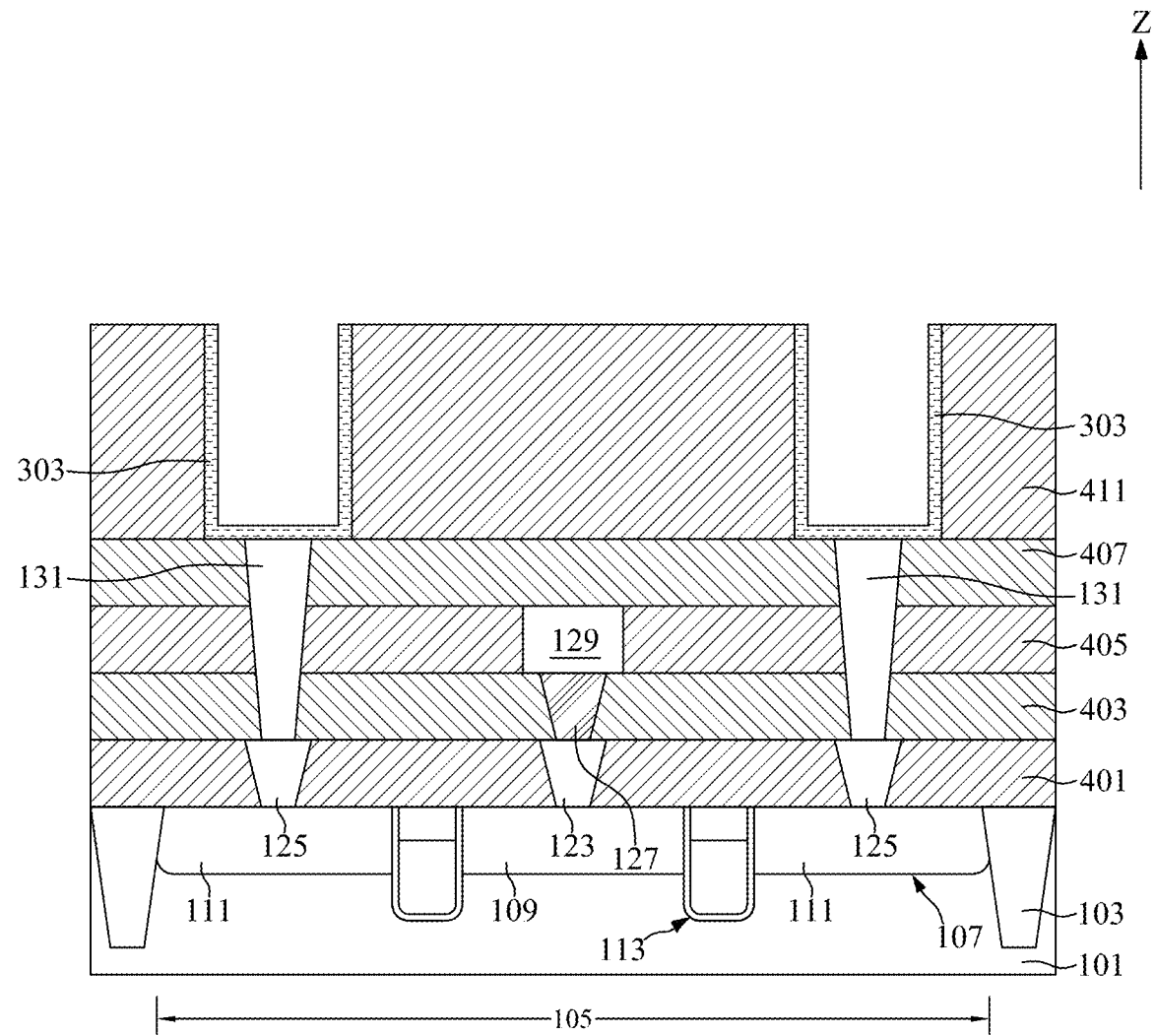
FIGS. 25 and 26 illustrate, in schematic cross-sectional diagrams, part of a flow of fabricating a semiconductor device in accordance with one embodiment of the present disclosure.
Figure 26:
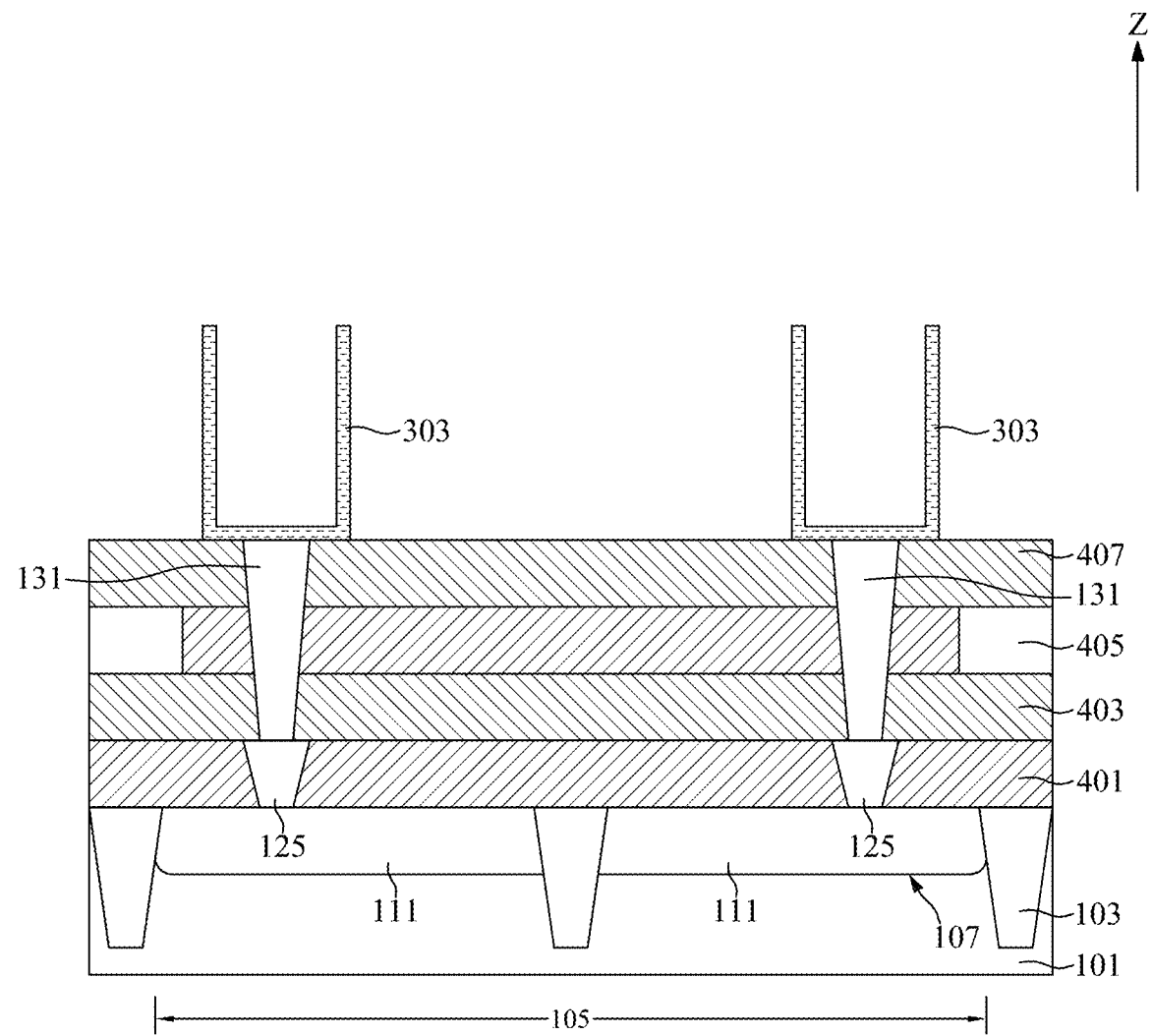
Figure 27:
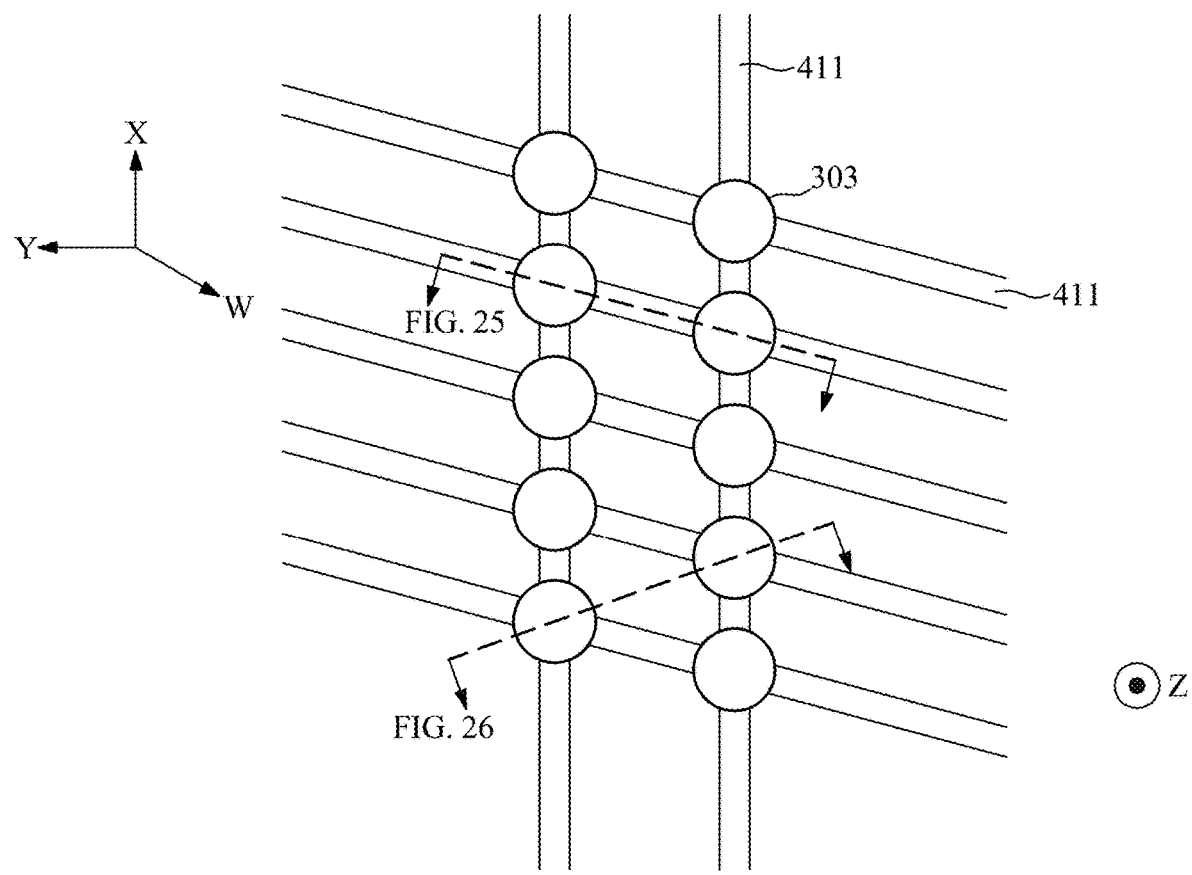
FIG. 27 illustrates, in a schematic top-view diagram, the semiconductor device in accordance with FIGS. 25 and 26.
Figure 28:
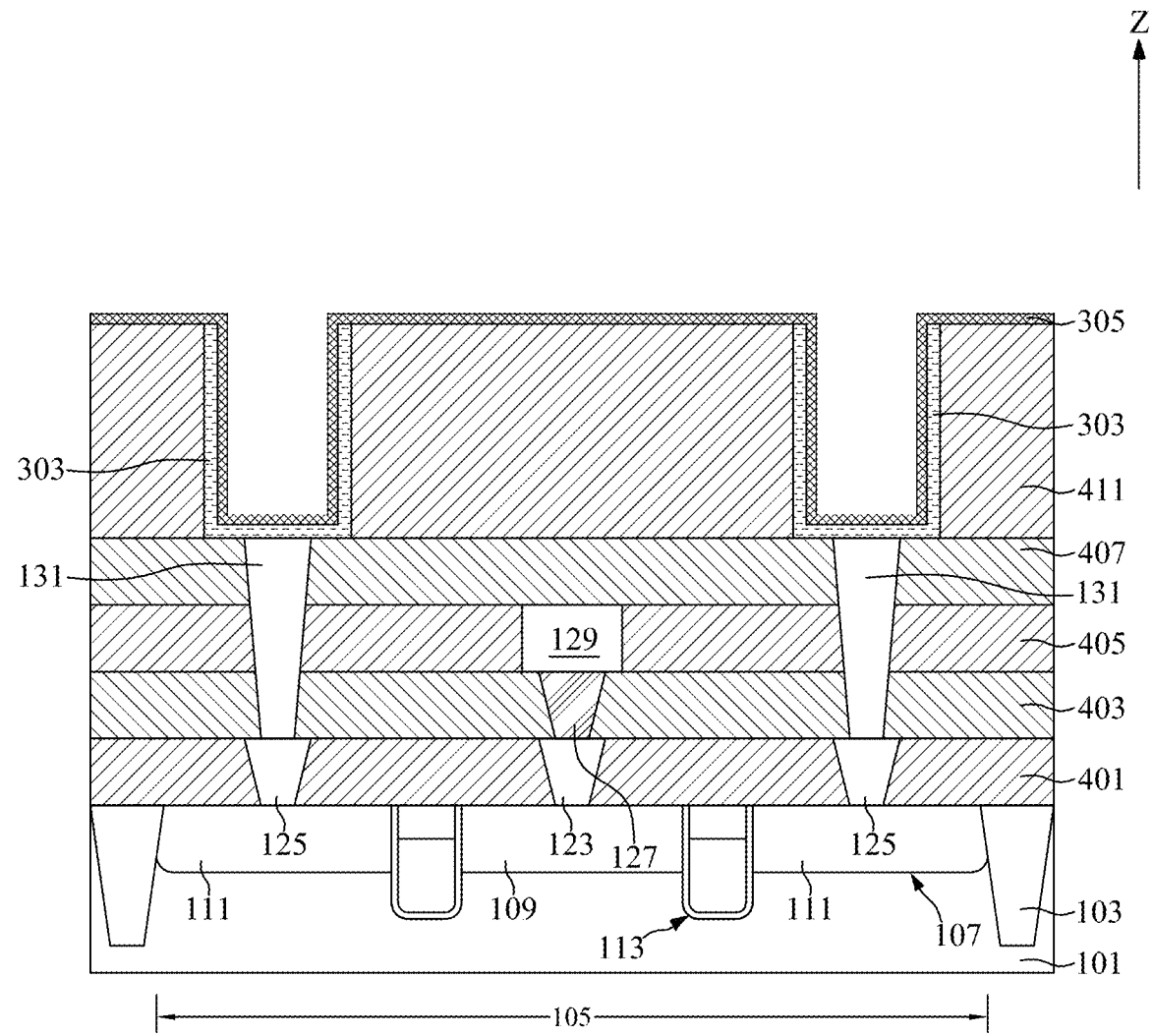
FIGS. 28 and 29 illustrate, in schematic cross-sectional diagrams, part of a flow of fabricating a semiconductor device in accordance with one embodiment of the present disclosure.
Figure 29:
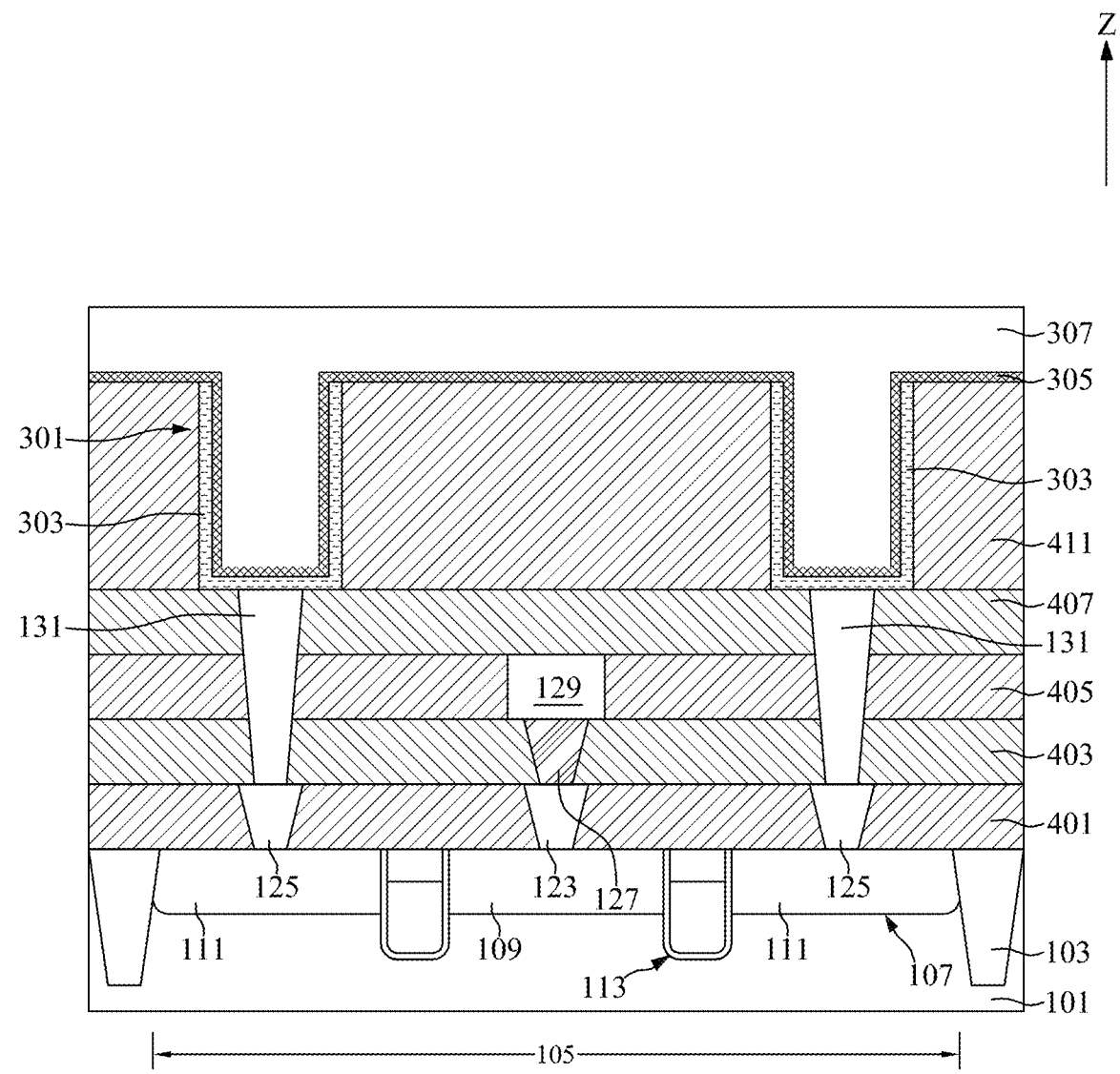

FIGS. 19 and 20 illustrate, in schematic cross-sectional diagrams, part of a flow of fabricating a semiconductor device in accordance with one embodiment of the present disclosure. FIG. 21 illustrates, in a schematic top-view diagram, the semiconductor device in accordance with FIG. 20. FIGS. 22 and 23 illustrate, in schematic cross-sectional diagrams, part of a flow of fabricating a semiconductor device in accordance with one embodiment of the present disclosure. FIG. 24 illustrates, in a schematic top-view diagram, the semiconductor device in accordance with FIGS. 22 and 23. FIGS. 25 and 26 illustrate, in schematic cross-sectional diagrams, part of a flow of fabricating a semiconductor device in accordance with one embodiment of the present disclosure. FIG. 27 illustrates, in a schematic top-view diagram, the semiconductor device in accordance with FIGS. 25 and 26. FIGS. 28 and 29 illustrate, in schematic cross-sectional diagrams, part of a flow of fabricating a semiconductor device in accordance with one embodiment of the present disclosure. Some elements of the semiconductor device of the present disclosure are not shown in FIGS. 20, 24, and 27 for clarity.

With reference to FIGS. 19 to 29, at step S21, in the embodiment depicted, a capacitor structure 301 may be formed above the substrate 101. The capacitor structure 301 may include a plurality of capacitor bottom electrodes 303, a capacitor insulating layer 305, and a capacitor top electrode 307. With reference to FIG. 19, a fourth insulating film 407 may be formed on the third insulating film 405. A plurality of plugs 131 may be formed penetrating through the fourth insulating film 407, the third insulating film 405, and the second insulating film 403. For each of the plurality of active regions 105, the plurality of plugs 131 may be respectively correspondingly disposed above the second contacts 125.

With reference to FIGS. 20 and 21, a fifth insulating film 409 may be formed on the fourth insulating film 407. A plurality of capacitor trenches 309 may be inwardly formed in the fifth insulating film 409. A plurality of capacitor bottom electrodes 303 may be respectively correspondingly formed in the plurality of capacitor trenches 309. It should be noted that, at the current stage, the fifth insulating film 409 may surround entire outer surfaces of the plurality of capacitor bottom electrodes 303.

With reference to FIGS. 22 to 24, a photolithography process may be performed to deposit a mask layer 701 over the fifth insulating film 409. After developing, the mask layer 701 may be formed into a plurality of lines extending along the direction W and a plurality of lines extending along the direction X. The mask layer 701 may protect portions of the fifth insulating film 409 underneath the mask layer 701.

With reference to FIGS. 25 to 27, an etch process, such as an anisotropic dry etch process, may be subsequently performed to remove most of the fifth insulating film 409 and turn the remaining portion of the fifth insulating film 409 into a plurality of supporting structures 411. The plurality of supporting structures 411 may be only attached to portions of the outer surfaces of the plurality of capacitor bottom electrodes 303. Some of the plurality of supporting structures 411 may extend along the direction W and may be separated from each other. Others of the plurality of supporting structures 411 may extend along the direction X and may be separated from each other. That is to say, there may be a plurality of spaces located among the plurality of supporting structures 411.

With reference to FIG. 28, a capacitor insulating layer 305 may be formed over the plurality of capacitor bottom electrodes 303 and the plurality of supporting structures 411. With reference to FIG. 29, a capacitor top electrode 307 may be formed over the capacitor insulating layer 305 and may fill the plurality of spaces located among the plurality of supporting structures 411. A planarization process, such as chemical mechanical polishing, may be performed to provide a substantially flat surface for subsequent processing steps. A capacitance of the capacitor structure 301 may be proportional to an area of the capacitor insulating layer 305 contacting both the plurality of capacitor bottom electrodes 303 and the capacitor top electrode 307. Due to the design of the plurality of supporting structures 411, the area of the capacitor insulating layer 305 contacting both the plurality of capacitor bottom electrodes 303 and capacitor top electrode 307 may be enlarged; therefore, the capacitance of the capacitor structure 301 may be improved. In other words, the performance of the semiconductor device may be improved.

FIGS. 30 to 35 illustrate, in schematic cross-sectional diagrams, part of a flow of fabricating a semiconductor device in accordance with one embodiment of the present disclosure.

Figure 30:
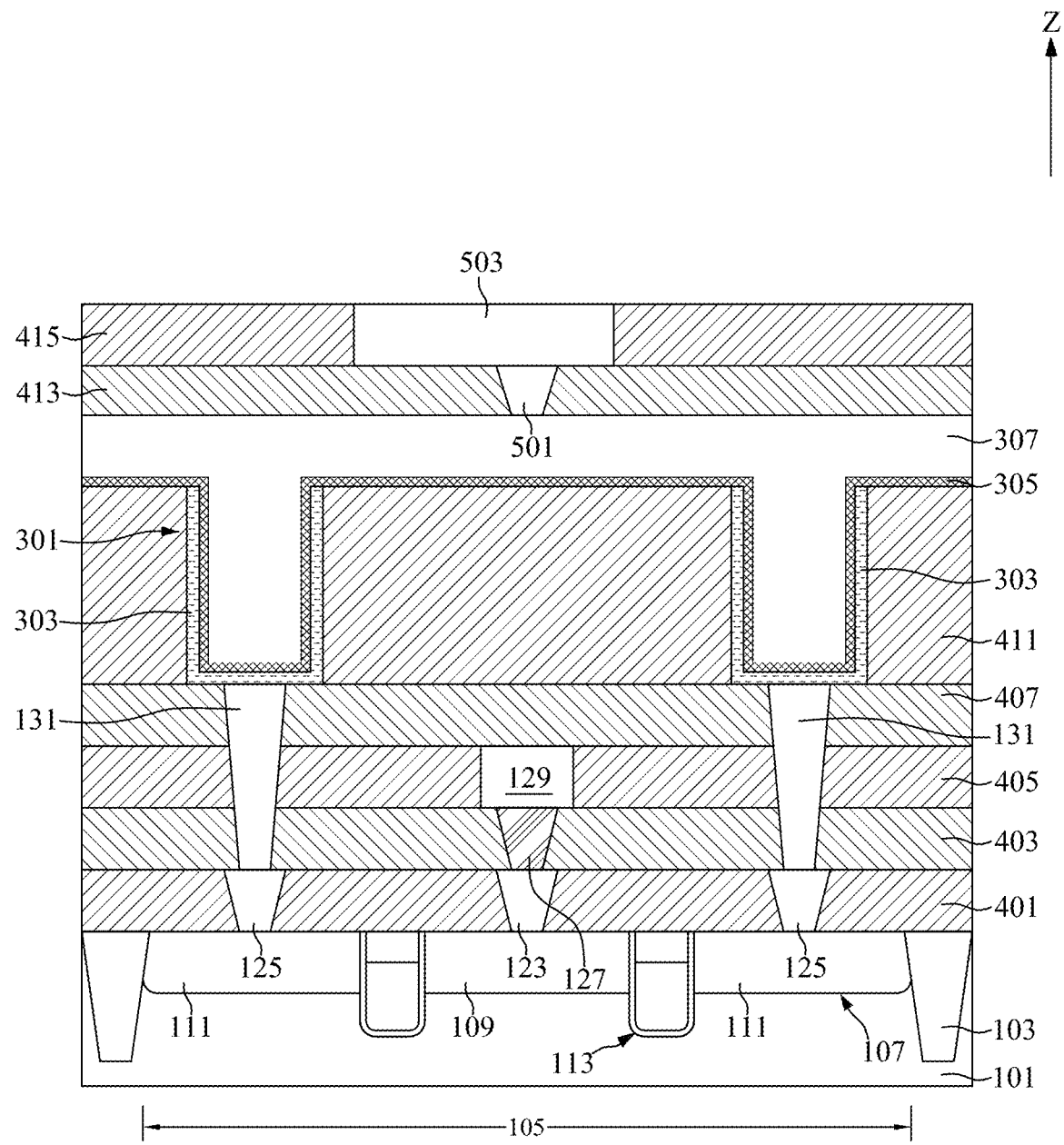
FIGS. 30 to 35 illustrate, in schematic cross-sectional diagrams, part of a flow of fabricating a semiconductor device in accordance with one embodiment of the present disclosure.
Figure 31:
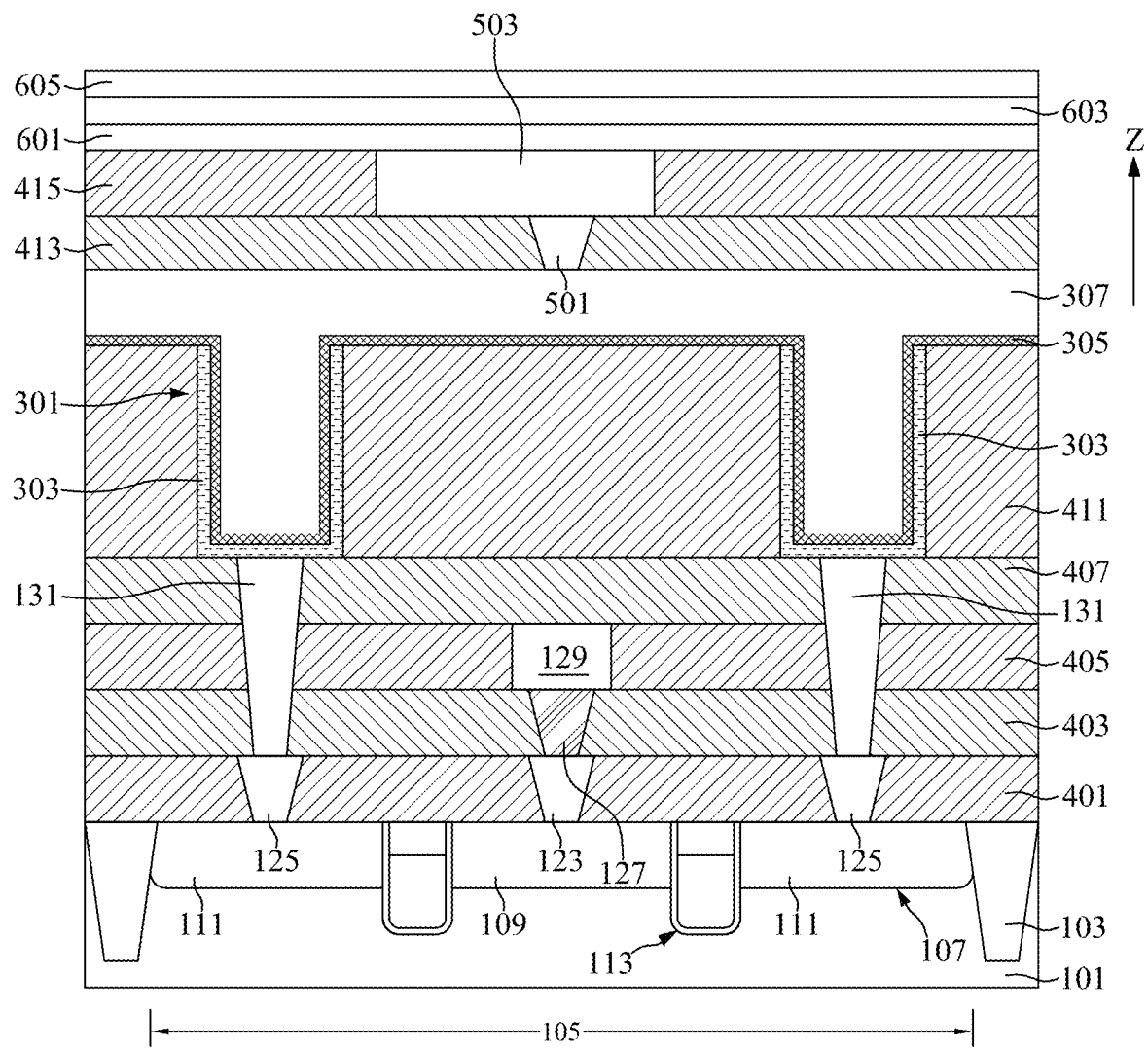

With reference to FIGS. 1, 6, and 30 to 35, at step S23, in the embodiment depicted, a first passivation layer 601, a second passivation layer 603, and a third passivation layer 605 may be formed above the substrate 101. With reference to FIG. 30, a sixth insulating film 413 may be formed on the capacitor top electrode 307. A seventh insulating film 415 may be formed on the sixth insulating film 413. A first via 501 may be formed in the sixth insulating film 413 and electrically connected to the capacitor top electrode 307. A first conductive line 503 may be formed in the seventh insulating film 415 and electrically connected to the first via 501. In the embodiment depicted, the first conductive line 503 may be copper. With reference to FIG. 31, the first passivation layer 601, the second passivation layer 603, and the third passivation layer 605 may be subsequently formed on the seventh insulating film 415. In the embodiment depicted, the first passivation layer 601 may be formed of silicon oxide, the second passivation layer 603 may be formed of silicon nitride, and the third passivation layer 605 may be formed of silicon oxide.

Figure 32:
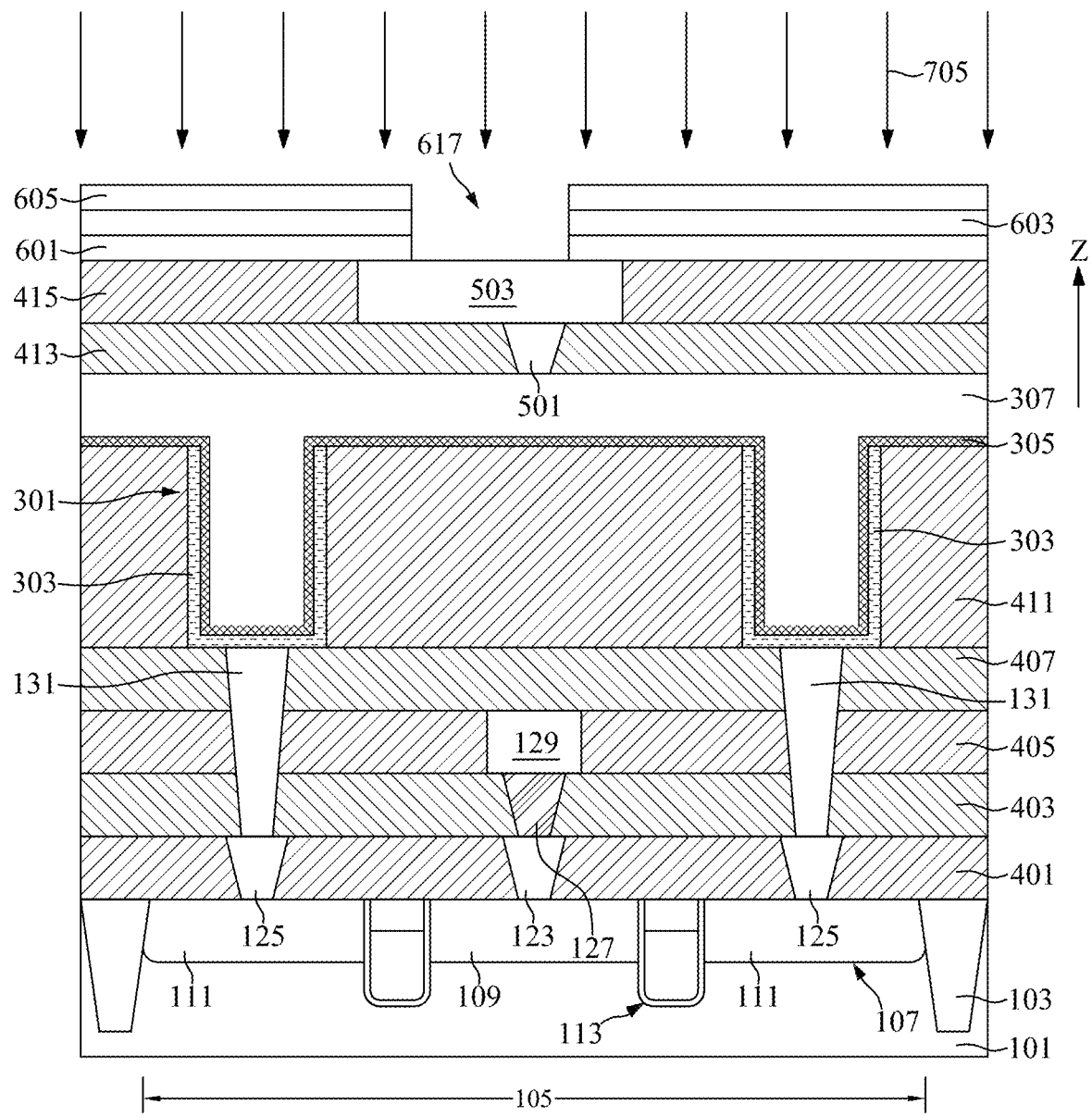

With reference to FIG. 32, at step S25, in the embodiment depicted, a pad opening 617 may be formed so as to penetrate through the third passivation layer 605, the second passivation layer 603, and the first passivation layer 601. Part of a top surface of the first conductive line 503 may be exposed through the pad opening 617. Subsequently, a cleaning process 705 may be performed over the third passivation layer 605 and the pad opening 617. The cleaning process 705 may include applying a mixture of hydrogen and argon as a remote plasma source with a process temperature ranging between about 250° C. and about 350° C. and a process pressure ranging between about 1 Torr and about 10 Torr in the presence of a bias energy applied to the equipment performing the cleaning process 705. The bias energy may be between about 0 W and 200 W. The cleaning process 705 may remove oxide, originating from oxidation by oxygen in the air, on the top surface of the first conductive line 503 without damaging the conductive feature of the first conductive line 503.

Figure 33:
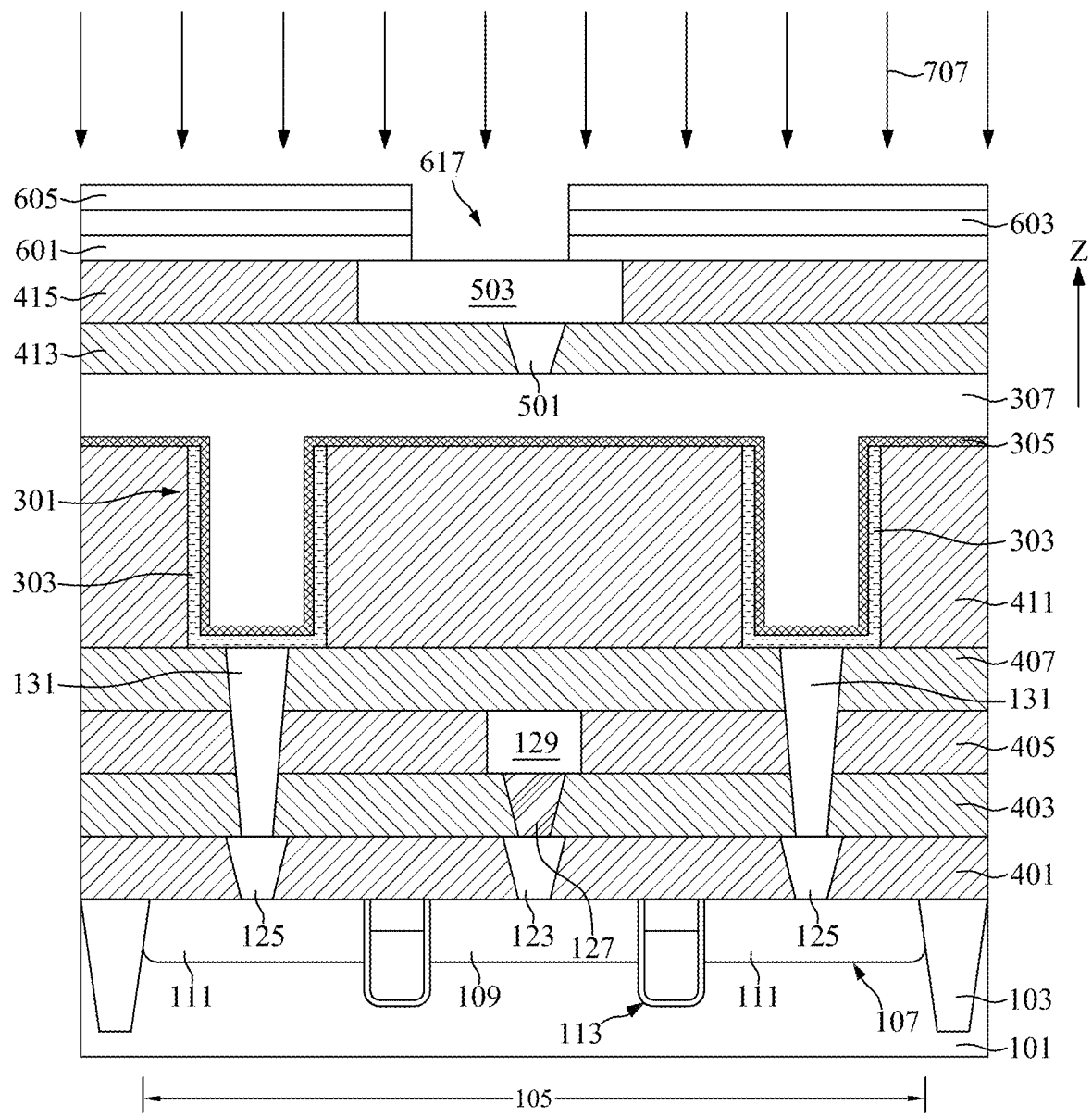

With reference to FIG. 33, at step S27, in the embodiment depicted, a passivation process 707 may be performed over the third passivation layer 605 and the pad opening 617. The passivation process 707 may include soaking the semiconductor device in a precursor such as dimethylaminotrimethylsilane, tetramethylsilane, or the like at a process temperature ranging between about 200° C. and about 400° C. An ultraviolet energy may be used to facilitate the passivation process 707. The passivation process 707 may passivate sidewalls of the third passivation layer 605, the second passivation layer 603, and the first passivation layer 601 exposed through the pad opening 617 by sealing surface pores thereof to reduce undesirable sidewall growth, which may affect the electric characteristics of the semiconductor device, during subsequent processing steps. As a result, the performance and reliability of the semiconductor device may be increased.

Figure 34:
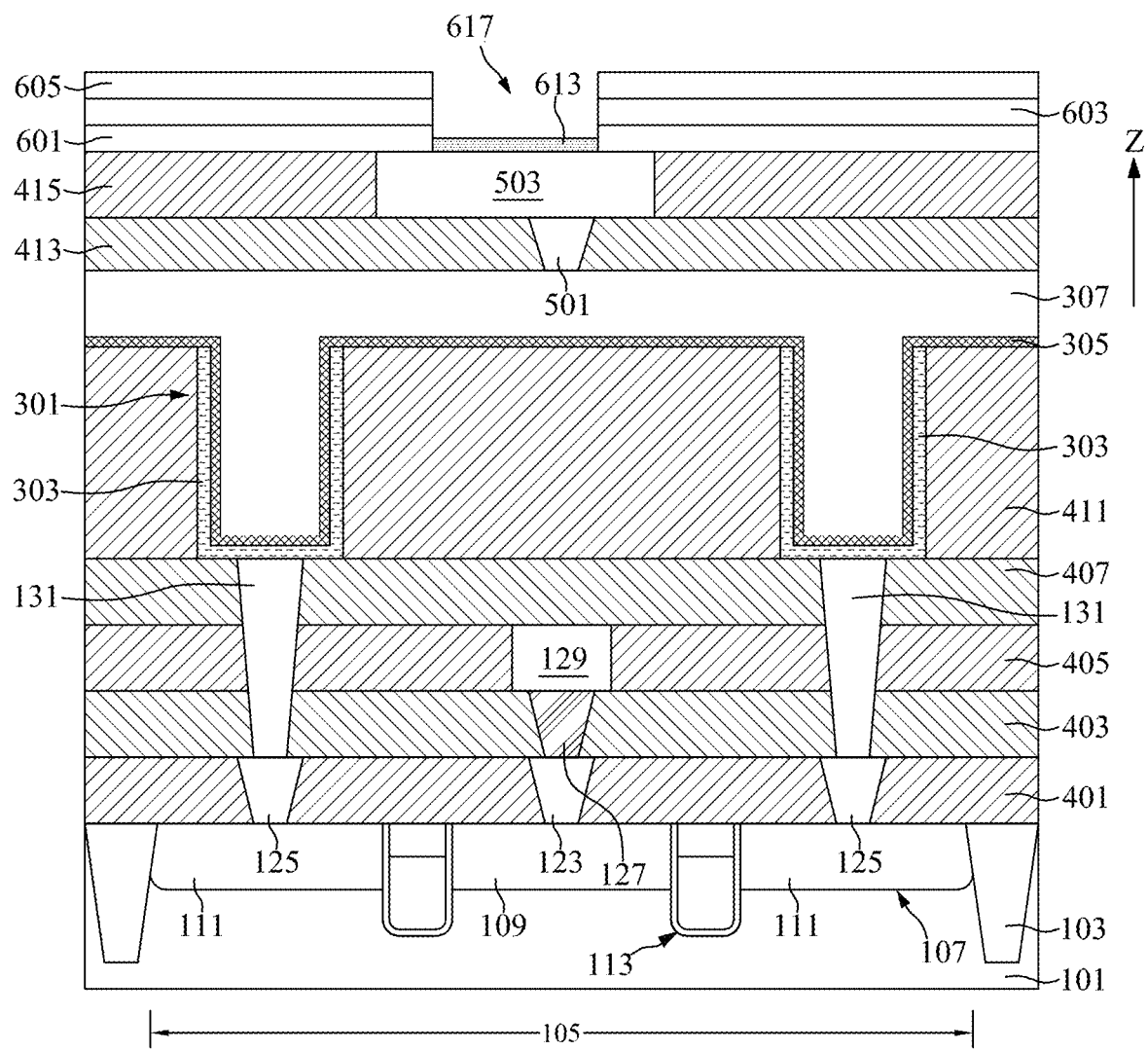
Figure 35:
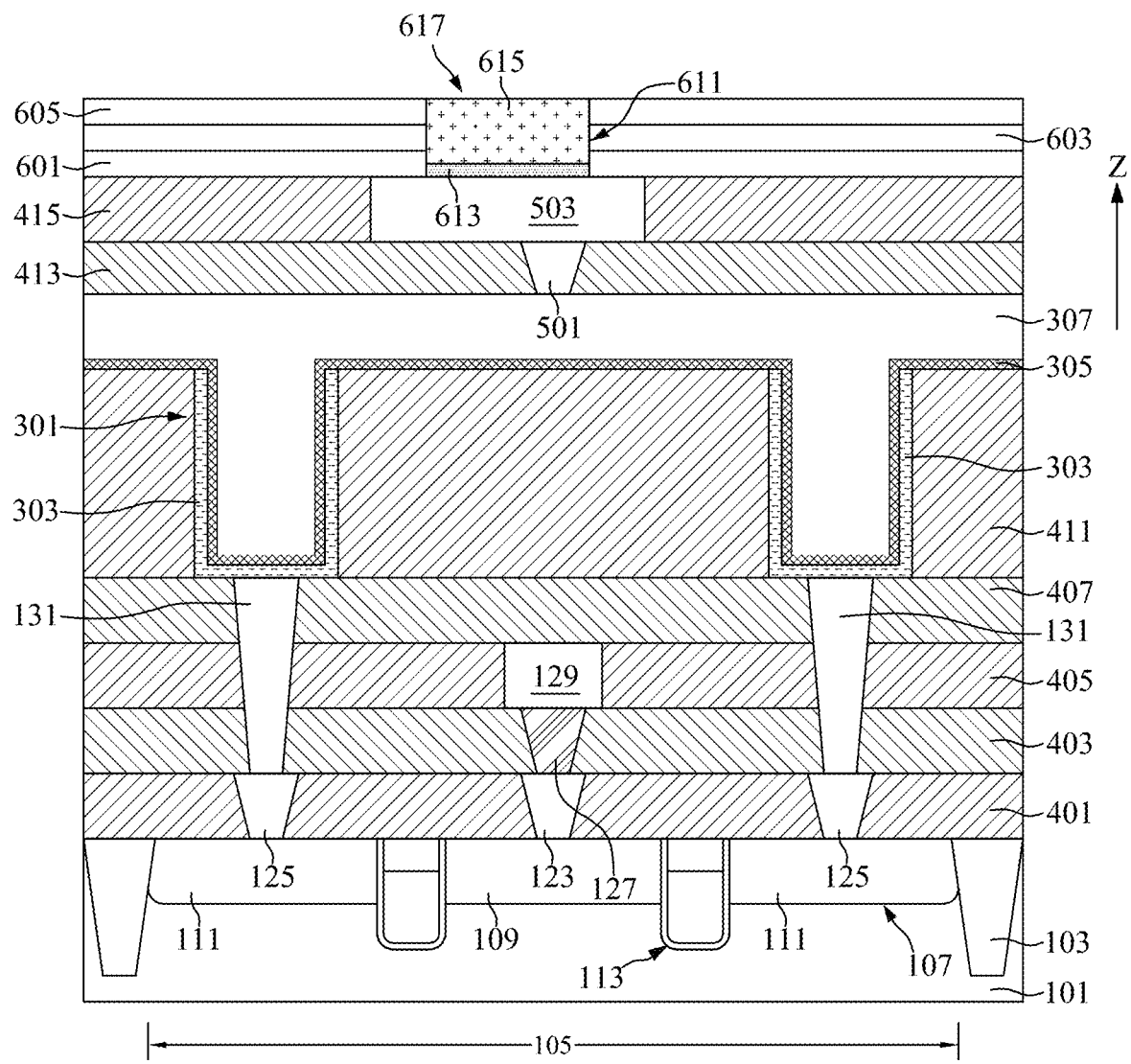

With reference to FIGS. 6 and 34, at step S29, in the embodiment depicted, the pad bottom conductive layer 613 may be formed on the first conductive line 503 in the pad opening 617 by electroplating or electroless plating. The pad bottom conductive layer 613 may include nickel and may serve as a barrier between the first conductive line 503 formed of copper and the pad top conductive layer 615 including palladium, cobalt, or a combination thereof. With reference to FIG. 35, at step S31, in the embodiment depicted, the pad top conductive layer 615 may be formed on the pad bottom conductive layer 613 in the pad opening 617 by electroplating or electroless plating. The pad top conductive layer 615 may include palladium, cobalt, or a combination thereof. A top surface of the pad top conductive layer 615 may include a plurality of heterogeneous nucleation sites such as topographical features, lattice discontinuities/orientations, surface defects, textures, or other surface features. The plurality of heterogeneous nucleation sites on the top surface of the pad top conductive layer 615 may facilitate a subsequent bonding process.

With reference back to FIG. 1, at step S33, in the embodiment depicted, the fourth passivation layer 607 may be formed on the third passivation layer 605 and a bonding opening 609 may be formed in the fourth passivation layer 607. The fourth passivation layer 607 may include polyimide or polyamide. A portion of the top surface of the pad top conductive layer 615 may be exposed through the bonding opening 609. A width W1 of the bonding opening 609 may be less than a width W2 of the pad top conductive layer 615.

FIGS. 36 to 39 illustrate, in schematic cross-sectional diagrams, part of a flow of fabricating a semiconductor device in accordance with another embodiment of the present disclosure.

Figure 36:
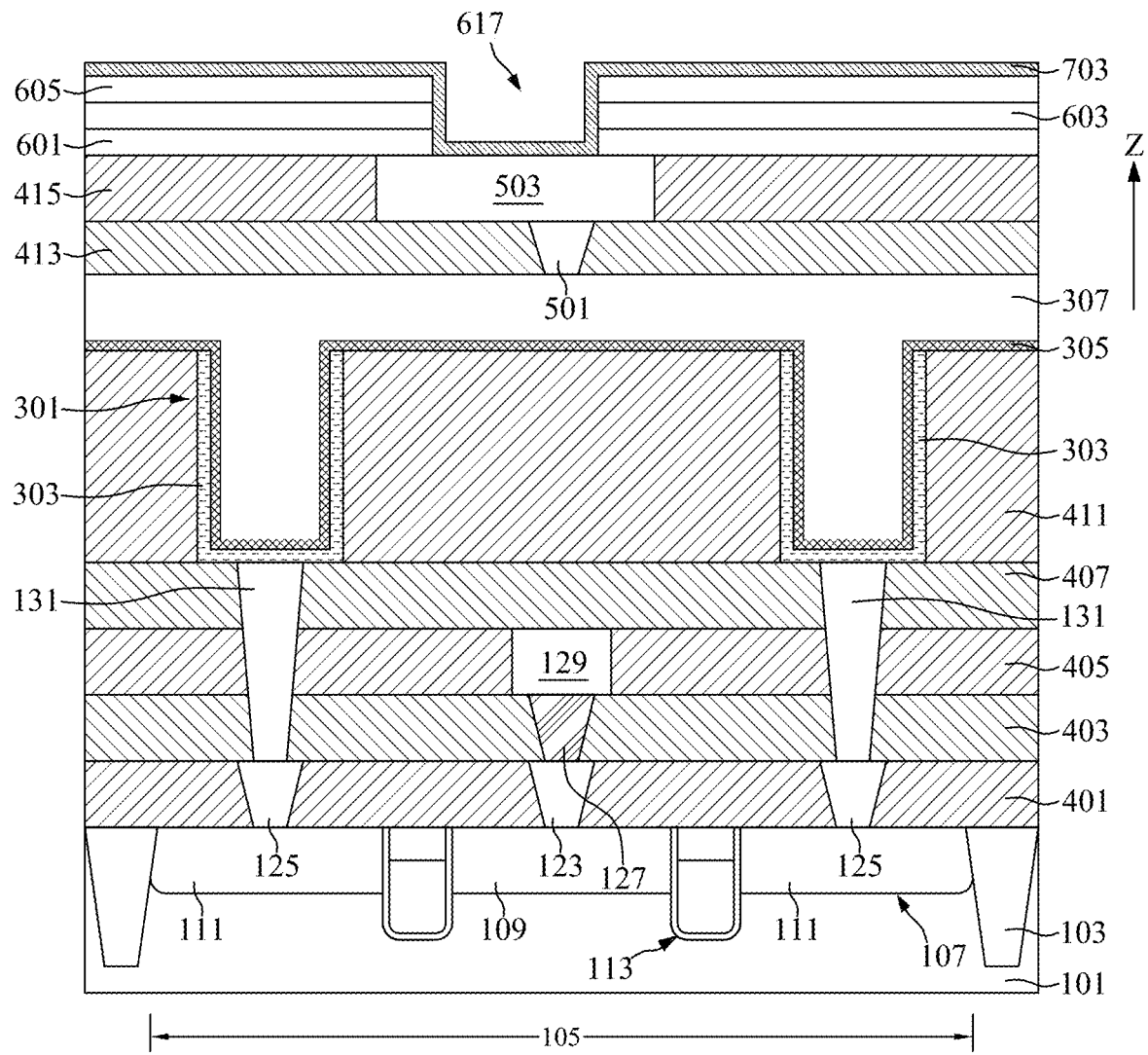
FIGS. 36 to 39 illustrate, in schematic cross-sectional diagrams, part of a flow of fabricating a semiconductor device in accordance with another embodiment of the present disclosure.
Figure 37:
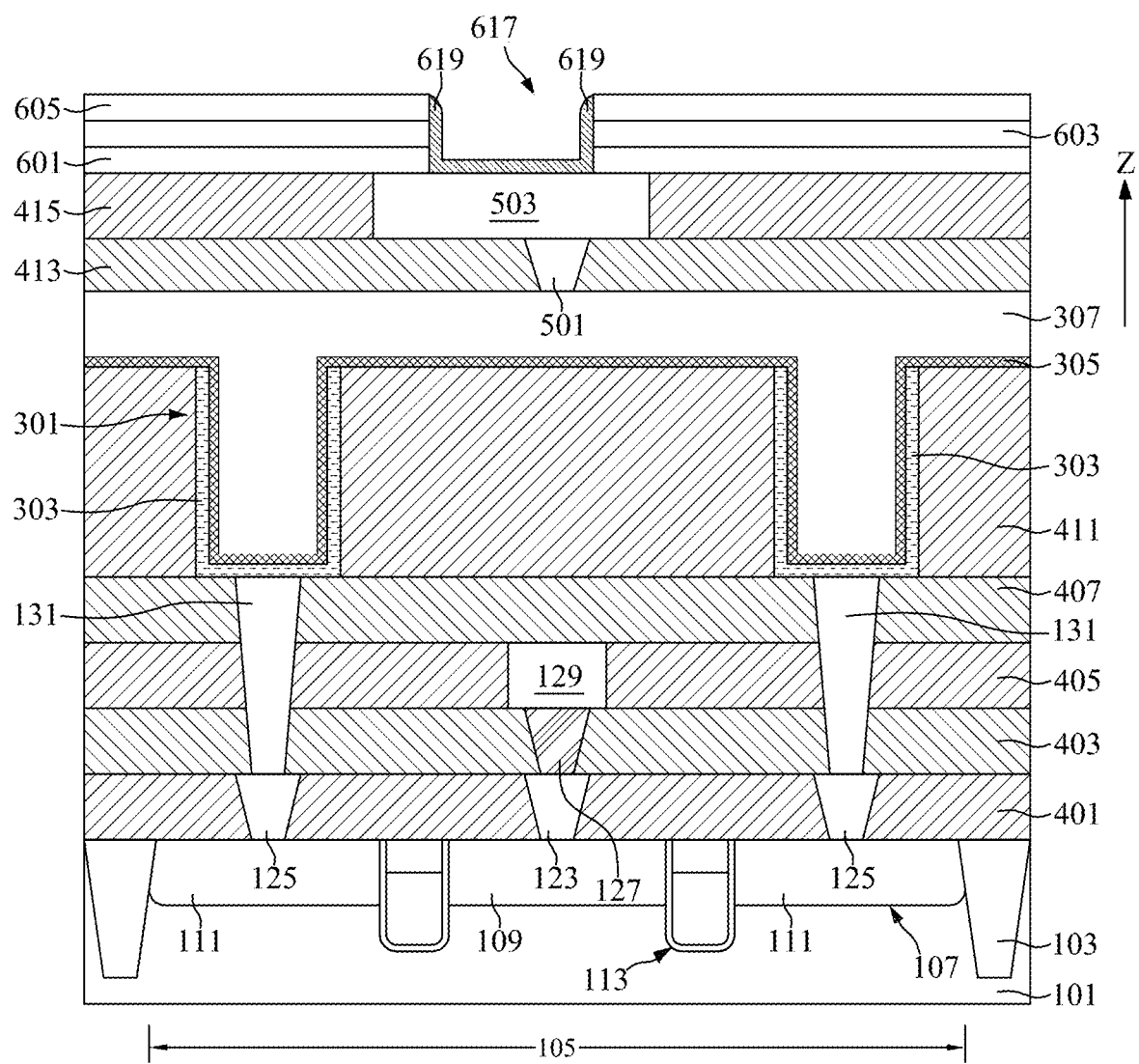

With reference to FIG. 36, a spacer layer 703 may be formed over the third passivation layer 605 and the pad opening 617 to cover top surfaces of the third passivation layer 605, sidewalls of the pad opening 617, and a bottom of the pad opening 617. An etch process, such as an anisotropic dry etch process, may be performed to remove the spacer layer 703 disposed on the top surfaces of the third passivation layer 605 and the bottom of the pad opening 617, and to conformally form spacers 619. The spacers 619 may isolate the sidewalls of the first passivation layer 601, the second passivation layer 603, and the third passivation layer 605 to prevent undesirable sidewall growth. Subsequently, a cleaning process 705 and passivation process 707 may be performed by a procedure similar to that illustrated in FIGS. 32 and 33.

Figure 38:
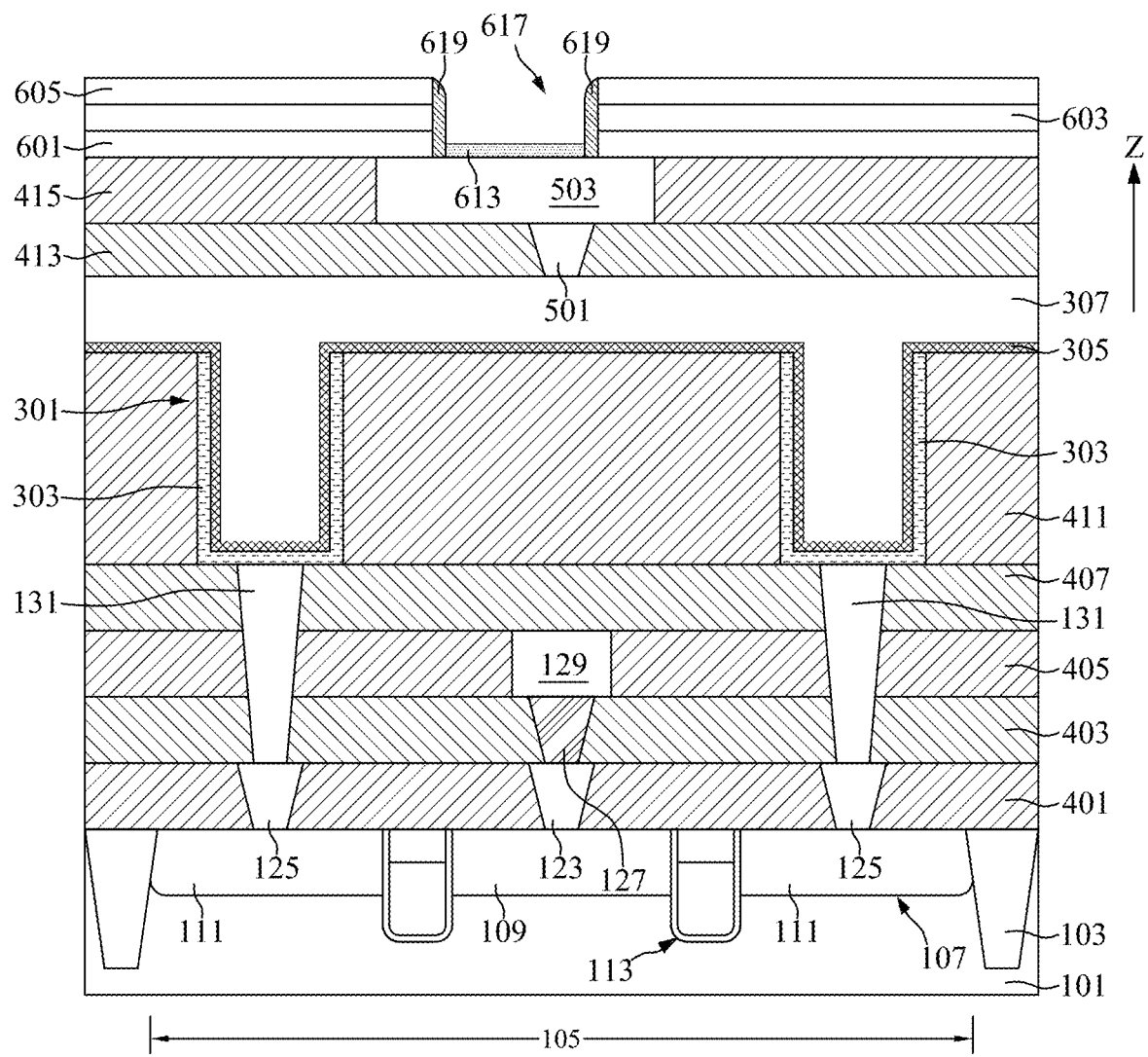
Figure 39:
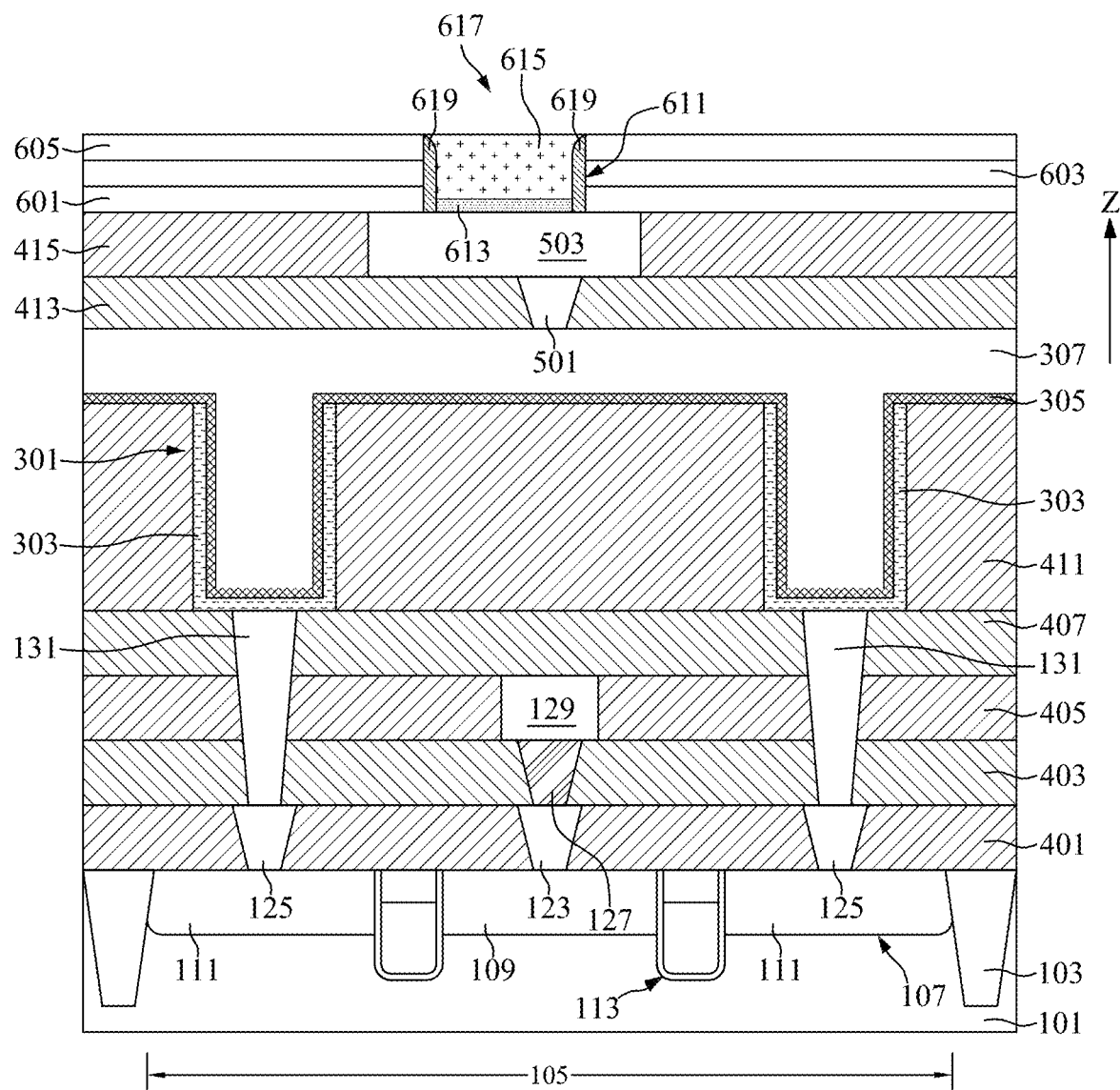

With reference to FIGS. 3, 38, and 39, the pad bottom conductive layer 613 may be formed on the first conductive line 503 and between the spacers 619. The pad top conductive layer 615 may be formed on the pad bottom conductive layer 613 and between the spacers 619. The fourth passivation layer 607 may be formed on the third passivation layer 605. The bonding opening 609 may be disposed in the fourth passivation layer 607. The top surface of the pad top conductive layer 615 may be exposed through the bonding opening 609.

One aspect of the present disclosure provides a semiconductor device including a substrate, a capacitor structure positioned above the substrate, a plurality of passivation layers positioned above the capacitor structure, and a pad structure positioned in the plurality of passivation layers. The pad structure comprises a pad bottom conductive layer comprising nickel and a pad top conductive layer positioned on the pad bottom conductive layer. The pad top conductive layer comprises palladium, cobalt, or a combination thereof.

Another aspect of the present disclosure provides a semiconductor device including a substrate, a gate structure positioned above the substrate, a plurality of passivation layers positioned above the gate structure, and a pad structure positioned in the plurality of passivation layers. The pad structure comprises a pad bottom conductive layer comprising nickel and a pad top conductive layer positioned on the pad bottom conductive layer. The pad top conductive layer comprises palladium, cobalt, or a combination thereof.

Another aspect of the present disclosure provides a method for fabricating a semiconductor device including providing a substrate, forming a capacitor structure above the substrate, forming a plurality of passivation layers above the capacitor structure, forming a pad opening in the plurality of passivation layers, performing a passivation process comprising soaking the pad opening in a precursor, and forming a pad structure in the pad opening. The precursor is dimethylaminotrimethylsilane or tetramethylsilane. Forming the pad structure in the pad opening comprises forming a pad bottom conductive layer comprising nickel in the pad opening and forming a pad top conductive layer on the pad bottom conductive layer. The pad top conductive layer comprises palladium, cobalt, or a combination thereof.

Due to the design of the semiconductor device of the present disclosure, the performance and reliability of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a gate structure positioned above the substrate;
a plurality of conductive elements disposed above the gate structure, wherein the plurality conductive elements include a conductive line is made of copper;
a plurality of passivation layers positioned above the gate structure; and
a pad structure positioned in the plurality of passivation layers;
wherein the pad structure comprises a pad bottom conductive layer comprising nickel and a pad top conductive layer positioned on the pad bottom conductive layer, the pad top conductive layer comprising palladium, cobalt, or a combination thereof, wherein the pad bottom conductive layer is disposed between and contacted with the conductive line and the pad top conductive layer.

2. The semiconductor device of claim 1, wherein the plurality of passivation layers comprise a first passivation layer positioned above the gate structure, a second passivation layer positioned on the first passivation layer, and a third passivation layer positioned on the second passivation layer, wherein the pad bottom conductive layer is positioned in the first passivation layer and electrically coupled to the gate structure.

3. The semiconductor device of claim 2, wherein the gate structure comprises a gate bottom layer positioned on the substrate, a gate middle layer positioned on the gate bottom layer, and a gate top layer positioned on the gate middle layer.

4. The semiconductor device of claim 3, further comprising a fourth passivation layer positioned on the third passivation layer, and a bonding opening positioned in the fourth passivation layer, wherein the fourth passivation layer comprises polyimide and a top surface of the pad top conductive layer is exposed through the bonding opening.

5. The semiconductor device of claim 4, wherein a width of the bonding opening is less than a width of the pad top conductive layer.

* * * * *